(12) United States Patent
Park et al.

(10) Patent No.: US 9,704,722 B2
(45) Date of Patent: Jul. 11, 2017

(54) METHOD OF FORMING FINE PATTERN AND METHOD OF MANUFACTURING INTEGRATED CIRCUIT DEVICE USING THE METHOD

(71) Applicants: Jeong-ju Park, Hwaseong-si (KR); Seung-chul Kwon, Suwon-si (KR); Eun-sung Kim, Seoul (KR); Jae-woo Nam, Anyang-si (KR); Shi-yong Yi, Seongnam-si (KR); Hyun-woo Kim, Seongnam-si (KR)

(72) Inventors: Jeong-ju Park, Hwaseong-si (KR); Seung-chul Kwon, Suwon-si (KR); Eun-sung Kim, Seoul (KR); Jae-woo Nam, Anyang-si (KR); Shi-yong Yi, Seongnam-si (KR); Hyun-woo Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/958,072

(22) Filed: Dec. 3, 2015

(65) Prior Publication Data

US 2016/0172187 A1 Jun. 16, 2016

(30) Foreign Application Priority Data

Dec. 15, 2014 (KR) ........................ 10-2014-0180500

(51) Int. Cl.
*G03F 7/40* (2006.01)
*H01L 21/311* (2006.01)
(Continued)

(52) U.S. Cl.
CPC ........ *H01L 21/31144* (2013.01); *B82Y 10/00* (2013.01); *B82Y 40/00* (2013.01);
(Continued)

(58) Field of Classification Search
CPC .... G03F 7/0002; G03F 7/0035; G03F 7/2059; G03F 7/40; G03F 7/165; G03F 7/2022;
(Continued)

(56) References Cited

U.S. PATENT DOCUMENTS 6,297,076 B1 10/2001 Amagai et al.
6,395,850 B1 5/2002 Charmot et al.
(Continued)

FOREIGN PATENT DOCUMENTS

KR 20100076608 A 7/2010
KR 20130034778 A 4/2013
KR 20130113596 A 10/2013

OTHER PUBLICATIONS

Karl O. Stuen et al. "Dimensional Scaling of Cylinders in Thin Films of Block Copolymer-Homopolymer Ternary Blends". Macromolecules Articles. American Chemical Society. 2009. pp. 5139-5145.

*Primary Examiner* — Amanda C Walke
(74) *Attorney, Agent, or Firm* — Harness, Dickey & Pierce, P.L.C.

(57) ABSTRACT

A method of forming a fine pattern includes forming pillar-shaped guides regularly arranged on a feature layer, forming a block copolymer layer on the feature layer around the pillar-shaped guides, phase separating the block copolymer layer, forming first domains regularly arranged on the feature layer with the pillar-shaped guides, forming a second domain on the feature layer surrounding the pillar-shaped guides and the first domains, removing the first domains, and forming holes corresponding with the first domains in the feature layer by etching the feature layer using the pillar-shaped guides and the second domain as etch masks. The block copolymer layer includes a polymer blend having first and second polymer blocks having first and second repeat units, respectively, a first homopolymer and a second
(Continued)

B – B' homopolymer. The first domains include the first polymer block and the first homopolymer, and the second domain includes the second polymer block and the second homopolymer.

20 Claims, 58 Drawing Sheets

(51) Int. Cl.

| | |
|---|---|
| *G03F 7/00* | (2006.01) |
| *C08L 53/00* | (2006.01) |
| *B82Y 10/00* | (2011.01) |
| *G03F 7/16* | (2006.01) |
| *G03F 7/20* | (2006.01) |
| *B82Y 40/00* | (2011.01) |
| *H01L 21/02* | (2006.01) |
| *H01L 21/027* | (2006.01) |
| *H01L 21/3065* | (2006.01) |
| *H01L 21/033* | (2006.01) |
| *H01L 21/308* | (2006.01) |
| *H01L 21/3213* | (2006.01) |
| *H01L 27/108* | (2006.01) |

(52) U.S. Cl.
CPC ............. *C08L 53/00* (2013.01); *G03F 7/002* (2013.01); *G03F 7/0035* (2013.01); *G03F 7/165* (2013.01); *G03F 7/2022* (2013.01); *G03F 7/2059* (2013.01); *G03F 7/40* (2013.01); *H01L 21/0274* (2013.01); *H01L 21/02112* (2013.01); *H01L 21/0332* (2013.01); *H01L 21/0337* (2013.01); *H01L 21/3065* (2013.01); *H01L 21/3086* (2013.01); *H01L 21/32139* (2013.01); *H01L 27/10855* (2013.01)

(58) Field of Classification Search
CPC ........... H01L 21/0274; H01L 21/02112; H01L 21/3065; H01L 21/0392; B82Y 10/00; B82Y 40/00; C08L 53/00
USPC .... 430/270.1, 311, 313, 314, 317, 322, 325, 430/329, 330, 331, 296, 323; 438/700, 438/689, 711, 699, 781; 216/47, 51
See application file for complete search history.

(56) References Cited

U.S. PATENT DOCUMENTS

| | | | |
|---|---|---|---|
| 8,287,957 B2 | 10/2012 | Nealey et al. | |
| 8,334,089 B2 | 12/2012 | Yi et al. | |
| 8,501,304 B2 * | 8/2013 | Stoykovich | B81C 1/00031 428/195.1 |
| 9,183,870 B2 * | 11/2015 | Nealey | B81C 1/00031 |
| 2009/0200646 A1 * | 8/2009 | Millward | B81C 1/00031 257/632 |
| 2010/0297847 A1 * | 11/2010 | Cheng | B81C 1/00031 438/694 |
| 2011/0147983 A1 * | 6/2011 | Cheng | B81C 1/00031 264/220 |
| 2012/0076978 A1 * | 3/2012 | Millward | B81C 1/00031 428/120 |
| 2012/0196089 A1 | 8/2012 | Yang et al. | |
| 2013/0034811 A1 | 2/2013 | Peeters et al. | |
| 2013/0240481 A1 * | 9/2013 | Senzaki | C08L 53/00 216/49 |
| 2013/0330668 A1 | 12/2013 | Wu et al. | |
| 2014/0061154 A1 | 3/2014 | Kim et al. | |
| 2014/0091476 A1 | 4/2014 | Nyhus et al. | |
| 2014/0106575 A1 | 4/2014 | Yoshimoto | |
| 2014/0193976 A1 | 7/2014 | Kim et al. | |
| 2014/0287587 A1 | 9/2014 | Lee et al. | |
| 2014/0322917 A1 * | 10/2014 | Abdallah | H01L 21/3081 438/703 |
| 2015/0044874 A1 * | 2/2015 | Matsunaga | H01L 21/0337 438/702 |
| 2015/0104946 A1 * | 4/2015 | Park | H01L 21/0337 438/703 |

* cited by examiner

B - B'

B - B'

| L₀ 51 nm BCP + PS, PMMA Ternary blend | | |
|---|---|---|
| (E1) Pure BCP 60% + PS,PMMA 40% | (E2) Pure BCP 55% + PS,PMMA 45% | (E3) Pure BCP 50% + PS,PMMA 50% |
|  |  |  |

METHOD OF FORMING FINE PATTERN AND METHOD OF MANUFACTURING INTEGRATED CIRCUIT DEVICE USING THE METHOD

CROSS-REFERENCE TO RELATED APPLICATION

This application claims the benefit of Korean Patent Application No. 10-2014-0180500, filed on Dec. 15, 2014, in the Korean Intellectual Property Office, the disclosure of which is incorporated herein in its entirety by reference.

BACKGROUND

1. Field

Example embodiments of the inventive concepts relate to a method of forming a fine pattern and a method of manufacturing an integrated circuit device, and more particularly, to a method of forming a fine pattern using a block copolymer and a method of manufacturing an integrated circuit device using the method.

2. Description of the Related Art

As the degree of integration of a semiconductor device increases, an area of each unit cell in two dimensions decreases. With a decrease in an area of a unit cell, a design rule for a nanoscale critical dimension (CD) that ranges from several to tens of nanometers (nm) is used, an opening has a nanoscale size, and a new method of forming a pattern which may improve CD uniformity is demanded.

SUMMARY

Example embodiments of the inventive concepts provide a method of forming a fine pattern which may more easily form a plurality of hole patterns that are repeatedly formed at fine pitches in order to form a pattern that is necessary to manufacture a highly integrated semiconductor device exceeding a resolution limit in a photolithography process.

Example embodiments of the inventive concepts provide a method of more easily manufacturing an integrated circuit device including a plurality of hole patterns that are repeatedly formed at fine pitches in a limited area.

According to example embodiments of the inventive concepts, a method of forming a pattern includes forming a plurality of pillar-shaped guides on a feature layer, the plurality of pillar-shaped guides being regularly arranged, forming a block copolymer layer on the feature layer around the plurality of pillar-shaped guides, the block copolymer layer being made of a polymer blend including a pure block copolymer and a plurality of homopolymers, the pure block copolymer including a first polymer block having a first repeat unit and a second polymer block having a second repeat unit, the plurality of homopolymers including a first homopolymer and a second homopolymer, phase separating the block copolymer layer, forming a plurality of first domains regularly arranged on the feature layer with the plurality of pillar-shaped guides, the plurality of first domains including the first polymer block and the first homopolymer, forming a second domain on the feature layer surrounding the plurality of pillar-shaped guides and the plurality of first domains, the second domain including the second polymer block and the second homopolymer, removing the plurality of first domains, and forming a plurality of holes corresponding with the plurality of first domains in the feature layer by etching the feature layer using the plurality of pillar-shaped guides and the second domain as etch masks.

The first homopolymer may have the first repeat unit and the second homopolymer may have the second repeat unit.

Each of the first homopolymer and the second homopolymer may have a molecular weight ranging from about 1,000 g/mol to about 10,000 g/mol.

Forming the block copolymer layer may include coating the polymer blend on the feature layer, the polymer blend including the pure block copolymer and the plurality of homopolymers mixed at a weight ratio ranging from about 50:50 to about 95:5.

The first homopolymer may have the first repeat unit and the second homopolymer may have the second repeat unit, and the first homopolymer and the second homopolymer may have a weight ratio ranging from about 30:70 to about 50:50.

The first polymer block and the second polymer block may have a volume ratio ranging from about 20:80 to about 40:60.

The first polymer block may include one of poly(methyl methacrylate) (PMMA), poly(ethylene oxide) (PEO), poly (lactic acid) (PLA), and polyisoprene (PI), and the second polymer block may include polystyrene (PS).

The plurality of pillar-shaped guides may be formed of a material including silicon (Si).

Forming the plurality of pillar-shaped guides may include forming the plurality of pillar-shaped guides having a width in a range from about 0.5 to about 1.5 times a bulk period $L_0$ of the block copolymer layer, and the bulk period $L_0$ of the block copolymer layer ranging from about 40 nm to about 60 nm.

Forming the plurality of pillar-shaped guides may include forming the plurality of pillar-shaped guides arranged in a hexagonal array having a first pitch that is 1.73 times a bulk period $L_0$ of the block copolymer layer, and the bulk period $L_0$ of the block copolymer layer ranging from about 40 to about 60 nm.

Forming the plurality of pillar-shaped guides may include forming the plurality of pillar-shaped guides having a first pitch that is N times a bulk period $L_0$ of the block copolymer layer, N being an integer equal to or greater than 2, and the bulk period $L_0$ of the block copolymer layer ranging from about 40 nm to about 60 nm.

Forming the plurality of pillar-shaped guides may include forming the plurality of pillar-shaped guides regularly arranged to have a first pitch, and phase separating the block copolymer layer may arrange the plurality of first domains in a cylindrical shape at a central portion between at least two pillar-shaped guides of the plurality of pillar-shaped guides, and the plurality of pillar-shaped guides and the plurality of first domains are regularly arranged to have a second pitch, the second pitch being less than the first pitch.

Prior to forming the block copolymer layer, the method may further include forming an organic liner covering exposed surfaces of the plurality of pillar-shaped guides after the forming a plurality of pillar-shaped guides.

The organic liner may have a random copolymer including a first block having the first repeat unit, a second block having the second repeat unit, and a third block having a repeat unit including a primary hydroxyl group.

The third block may be included in the random copolymer in an amount ranging from about 0.01 weight % to about 10 weight % based on a total weight of the random copolymer.

Forming the organic liner may attach the random copolymer to the exposed surfaces of the plurality of pillar-shaped guides using the primary hydroxyl group of the third block as an anchoring group.

Forming the organic liner may include coating a random copolymer composition on the exposed surfaces of the plurality of pillar-shaped guides, the random copolymer composition including the random copolymer, reacting the primary hydroxyl group of the third block and the plurality of pillar-shaped guides with each other by heat-treating the random copolymer composition coated on the exposed surfaces of the plurality of pillar-shaped guides, the random copolymer being attached to the exposed surfaces of the plurality of pillar-shaped guides, and removing a non-reacted portion of the random copolymer composition using an organic solvent to expose the organic liner covering the exposed surfaces of the plurality of pillar-shaped guides.

The organic liner may be formed to have a thickness ranging from about 2 nm to about 15 nm.

According to example embodiments of the inventive concepts, a method of forming a pattern includes forming a feature layer on a substrate, forming a plurality of first holes in the feature layer, the plurality of first holes being regularly arranged to have a first pitch, forming a plurality of pillar-shaped guides filling the plurality of first holes, the plurality of pillar-shaped guides protruding upward further than the feature layer, forming a block copolymer layer on the feature layer around the plurality of pillar-shaped guides, the block copolymer layer made of a ternary blend including a pure block copolymer including a first polymer block having a first repeat unit and a second polymer block having a second repeat unit, a first homopolymer having the first repeat unit, and a second homopolymer having the second repeat unit, phase separating the block copolymer layer, forming a plurality of first domains regularly arranged on the feature layer with the plurality of pillar-shaped guides, forming a second domain on the feature layer surrounding the plurality of pillar-shaped guides and the plurality of first domains, removing the plurality of first domains, and forming a plurality of second holes in the feature layer by etching the feature layer using the plurality of pillar-shaped guides and the second domain as etch masks.

The plurality of first domains may include the first polymer block and the first homopolymer, and the second domain may include the second polymer block and the second homopolymer.

Forming the block copolymer layer may include forming the block copolymer layer including the first homopolymer and the second homopolymer having a molecular weight equal to or less than ½ of a molecular weight of the pure block copolymer.

Forming the plurality of pillar-shaped guides may include forming a plurality of pillar-shaped guide outer walls in the feature layer defining inner spaces exposing the feature layer before the forming a plurality of first holes, the plurality of pillar-shaped guide outer walls having widths greater than widths of the plurality of first holes, and forming a plurality of pillar cores including lower portions filling the plurality of first holes and extending portions filling the inner spaces after the forming a plurality of first holes, the extending portions protruding upward further than the feature layer.

Forming the block copolymer layer may form the block copolymer layer having a weight ratio between the first homopolymer and the second homopolymer in the ternary blend ranges from about 30:70 to about 50:50.

Forming the block copolymer layer may form the first polymer block and the second polymer block having a volume ratio in the pure block copolymer ranging from about 20:80 to about 40:60.

Forming the plurality of first holes may form the plurality of first holes arranged in a hexagonal array having a first pitch that is 1.73 times a bulk period $L_0$ of the block copolymer layer, and the bulk period $L_0$ of the block copolymer layer ranging from about 40 nm to about 60 nm.

Forming the plurality of first holes may form the plurality of first holes arranged to have a first pitch that is N times a bulk period $L_0$ of the block copolymer layer, N being an integer equal to or greater than 2, and the bulk period $L_0$ of the block copolymer layer ranging from about 40 nm to about 60 nm.

Forming the plurality of first holes may form the plurality of first holes regularly arranged to have a first pitch, and phase separating the block copolymer layer so that the plurality of first domains in a cylindrical shape at a central portion between at least two adjacent first holes of the plurality of first holes, and the plurality of first holes and the plurality of first domains are regularly arranged to have a second pitch, the second pitch being less than the first pitch.

Prior to forming the block copolymer layer, the method may further include forming a neutral organic liner on an exposed surface of the feature layer and exposed surfaces of the plurality of pillar-shaped guides after forming the plurality of pillar-shaped guides.

The neutral organic liner may have a random copolymer including a first block having the first repeat unit, a second block having the second repeat unit, and a third block having a repeat unit including a primary hydroxyl group.

According to example embodiments of the inventive concepts, a method of manufacturing an integrated circuit device includes forming an etch film on a substrate, forming a first mask pattern on the etch film, the first mask pattern including a plurality of first holes, forming a plurality of pillar-shaped guides filling the plurality of first holes, the plurality of pillar-shaped guides protruding upward further than the first mask pattern, forming a block copolymer layer on the first mask pattern around the plurality of pillar-shaped guides, the block copolymer layer made of a ternary blend including a pure block copolymer including a first polymer block and a second polymer block, a first homopolymer, and a second homopolymer; phase separating the block copolymer layer, forming a plurality of first domains regularly arranged on the feature layer, the plurality of first domains spaced apart from the plurality of pillar-shaped guides, forming a second domain on the feature layer surrounding the plurality of pillar-shaped guides and the plurality of first domains, removing the plurality of first domains, forming a plurality of second holes in the first mask pattern by etching the first mask pattern using the plurality of pillar-shaped guides and the second domain as etch masks, and forming a pattern by etching the etch film using the first mask pattern as an etch mask, the first mask pattern including the plurality of first holes and the plurality of second holes.

Forming the block copolymer layer may form the block copolymer layer having a bulk period ranging from about 40 nm to about 60 nm, forming the mask pattern may form the mask pattern including the plurality of first holes arranged in a hexagonal array having a first pitch that is at least 1.5 times the bulk period $L_0$ of the block copolymer layer, and the bulk period $L_0$ of the block copolymer layer ranging from about 40 nm to about 60 nm, and forming the pattern may form a plurality of third holes in the etch film, the plurality of third holes being arranged in a hexagonal array having a second pitch less than the first pitch.

The method may further include forming a neutral liner covering a top surface of the first mask pattern and side walls of the plurality of pillar-shaped guides before forming the block copolymer layer, wherein the block copolymer layer may be on the neutral liner.

The method may further include forming a first mask layer on the etch film, forming a second mask layer on the first mask layer, and forming a plurality of openings regularly arranged in the second mask layer by patterning the second mask layer to form a second mask pattern before the forming a first mask pattern on the etch film, wherein forming the first mask pattern may form the plurality of first holes regularly arranged therein by etching the first mask pattern using the second mask pattern as an etch mask.

Before forming the block copolymer layer, the method may further include removing the second mask pattern to expose a top surface of the first mask pattern after forming the plurality of pillar-shaped guides.

According to example embodiments of the inventive concepts, a method includes forming a plurality of pillar-shaped guides on a feature layer, the plurality of pillar-shaped guides being regularly arranged, forming a block copolymer layer around the plurality of pillar-shaped guides by coating a polymer blend on the feature layer, the polymer blend including a first polymer block, a second polymer block and a plurality of homopolymers, the first polymer block including one of poly(methyl methacrylate) (PMMA), poly(ethylene oxide) (PEO), poly(lactic acid) (PLA), and polyisoprene (PI), and the second polymer block including polystyrene (PS), and the polymer blend including the first and second polymer blocks and the plurality of homopolymers mixed at a weight ratio ranging from about 50:50 to about 95:5, and phase separating the block copolymer layer.

The method may further include forming a plurality of first domains regularly arranged on the feature layer with the plurality of pillar-shaped guides, the plurality of first domains including the first polymer block and a first homopolymer of the plurality of homopolymers, forming a second domain on the feature layer surrounding the plurality of pillar-shaped guides and the plurality of first domains, the second domain including the second polymer block and a second homopolymer of the plurality of homopolymers, removing the plurality of first domains, and forming a plurality of holes corresponding with the plurality of first domains in the feature layer by etching the feature layer using the plurality of pillar-shaped guides and the second domain as etch masks.

BRIEF DESCRIPTION OF THE DRAWINGS

Example embodiments of the inventive concepts will be more clearly understood from the following detailed description taken in conjunction with the accompanying drawings in which:

FIGS. 1A and 1B, 2A and 2B, 3A and 3B, 4A and 4B, 5A and 5B, 6A and 6B, 7A and 7B, 8A and 8B, 9A and 9B, and 10A and 10B are views according to a process order for explaining a method of forming a fine pattern, according to example embodiments, wherein FIGS. 1A, 2A, 3A, 4A, 5A, 6A, 7A, 8A, 9A, and 10A are plan views illustrating major parts for explaining the method and FIGS. 1B, 2B, 3B, 4B, 5B, 6B, 7B, 8B, 9B, and 10B are cross-sectional views taken along lines B-B' of FIGS. 1A, 2A, 3A, 4A, 5A, 6A, 7A, 8A, 9A, and 10A;

FIGS. 13A and 13B are views for explaining a method of forming a fine pattern, according to example embodiments, wherein FIG. 13A is a plan view illustrating major parts for explaining the method and FIG. 13B is a cross-sectional view taken along line B-B' of FIG. 13A;

DETAILED DESCRIPTION

Figure 1A:
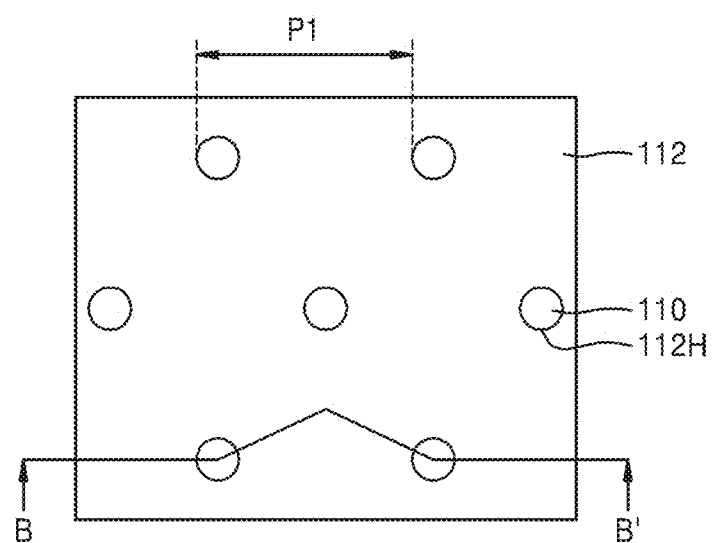

The inventive concepts will now be described more fully with reference to the accompanying drawings, in which example embodiments of the inventive concepts are shown. In the drawings, the same elements are denoted by the same reference numerals and a repeated explanation thereof will not be given.

Hereinafter, the inventive concepts will be described more fully with reference to the accompanying drawings, in which example embodiments of the inventive concepts are shown. The inventive concepts may, however, be embodied in many different forms and should not be construed as being limited to the example embodiments set forth herein; rather these embodiments are provided so that this disclosure will be thorough and complete, and will fully convey the concept of the inventive concepts to one of ordinary skill in the art.

It will be understood that, although the terms first, second, third etc. may be used herein to describe various members, regions, layers, parts, and/or elements, these members, regions, layers, parts, and/or elements should not be limited by these terms. These terms are only used to distinguish one member, region, layer, part, or element from another member, region, layer, part, or element. Thus, a first member, region, part, or element discussed below could be termed a second member, region, part, or element without departing from the teachings of example embodiments. For example, a first element may be referred to as a second element, and likewise, a second element may be referred to as a first element without departing from the scope of the inventive concepts.

All terms including technical and scientific terms used herein have meanings which can be generally understood by those of ordinary skill in the art, if the terms are not particularly defined. General terms defined by dictionaries should be understood to have meanings which can be contextually understood in the art and should not have ideally or excessively formal meanings, if the terms are not defined particularly herein by the inventive concepts.

A specific process order may be changed in example embodiments. For example, two processes which are described as being continuously performed may be simultaneously performed or may be performed in a reverse order.

As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. As used herein, the term "and/or" includes any and all combinations of one or more of the associated listed items. Expressions such as "at least one of" when preceding a list of elements, modify the entire list of elements and do not modify the individual elements of the list.

FIGS. 1A and 1B through 10A and 10B are views according to a process order for explaining a method of forming a fine pattern, according to example embodiments. FIGS. 1A, 2A, . . . , and 10A are plan views illustrating major parts for explaining the method and FIGS. 1B, 2B, . . . , and 10B are cross-sectional views taken along lines B-B' of FIGS. 1A, 2A, . . . , and 10A.

Figure 1B:
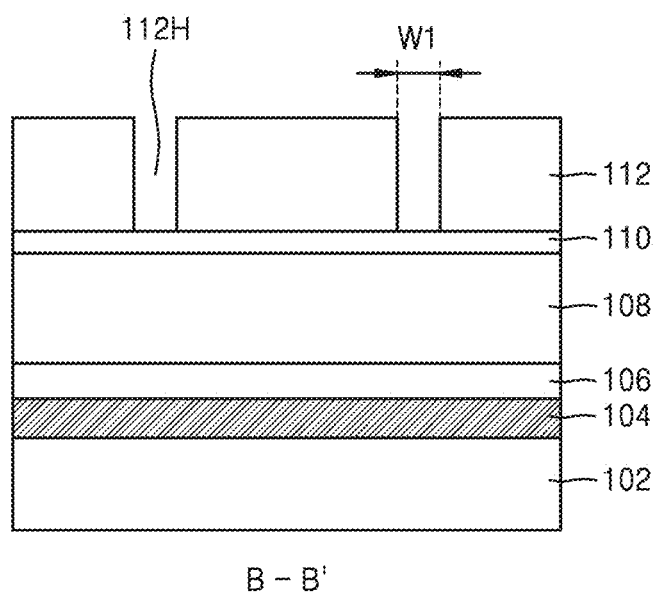
Figure 2A:
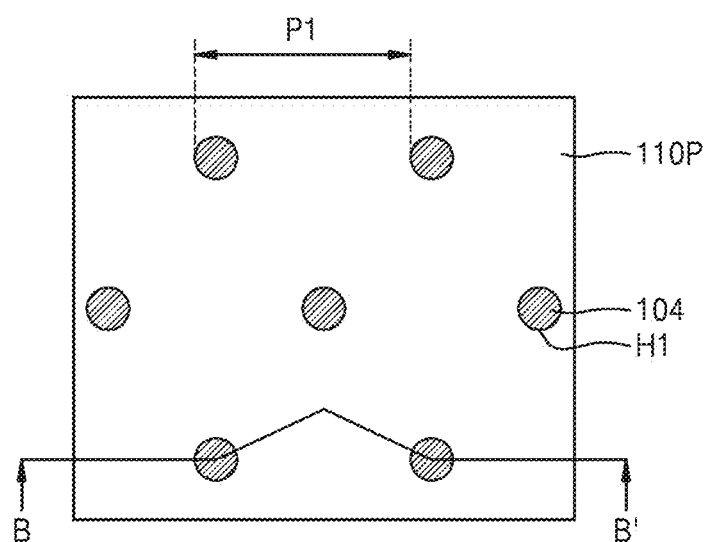

Referring to FIGS. 1A and 1B, an etch film 104 is formed on a substrate 102, and a first mask layer 106 and a second mask layer 108 are sequentially formed on the etch film 104.

The substrate 102 may be a semiconductor substrate. In example embodiments, the substrate 102 may be formed of a semiconductor, e.g., silicon (Si) or germanium (Ge). In example embodiments, the substrate 102 may include a compound semiconductor, e.g., SiGe, SiC, GaAs, InAs, or InP. In example embodiments, the substrate 102 may have a silicon on insulator (SOI) structure. The substrate 102 may include a conductive region, for example, a well doped with impurities or a structure doped with impurities. Also, the substrate 102 may have any of various device isolation structures, e.g., a shallow trench isolation (STI) structure.

The etch film 104 may be an insulating film or a conductive film. For example, the etch film 104 may be formed of, but is not limited to, a metal, an alloy, metal carbide, metal nitride, metal oxynitride, metal oxycarbide, semiconductor, polysilicon, oxide, nitride, oxynitride, hydrocarbon, or a combination thereof. When a pattern that is to be finally formed is formed on the substrate 102, the etch film 104 may be omitted.

The first mask layer 106 may be used as a feature layer for forming a final pattern to be formed on the etch film 104 and transferring the final pattern to the etch film 104. In example embodiments, the first mask layer 106 may have a hydrophilic surface. In example embodiments, a silanol group may be exposed through a surface of the first mask layer 106.

In example embodiments, the first mask layer 106 may be formed of a material including Si. For example, the first mask layer 106 may be formed of, but is not limited to, a silicon nitride film, a silicon oxide film, a silicon oxynitride film, a silicon carbonitride film, or a combination thereof. The first mask layer 106 may be formed to have a thickness ranging from, but is not limited to, about 100 Å to about 500 Å.

The second mask layer 108 may be formed of a material different from that of the first mask layer 106. For example, when the first mask layer 106 is formed of a silicon nitride film, a silicon oxynitride film, and/or a silicon carbonitride film, the second mask layer 108 may be formed of a carbon-containing film, e.g., a spin-on hardmask (SOH) material, a silicon oxide film, or a combination thereof. The carbon-containing film, e.g., a SOH material, may include an organic compound having a relatively high carbon content ranging from about 85 weight % to about 99 weight % based on a total weight. The organic compound may include a hydrocarbon compound including an aromatic ring, e.g., phenyl, benzene, or naphthalene, or a derivative thereof. The second mask layer 108 may be formed to have a thickness ranging from, but is not limited to, about 500 Å to about 3000 Å.

An anti-reflection film 110 is formed on the second mask layer 108, and a third mask pattern 112 in which a plurality of holes 112H are formed is formed on the anti-reflection film 110.

The anti-reflection film 110 may be any film as long as it is used for a typical photolithography process. In example embodiments, the anti-reflection film 110 may be formed of a material including Si. In example embodiments, the anti-reflection film 110 may be a silicon oxynitride film. In example embodiments, the anti-reflection film 110 may be formed of an organic anti-reflective coating (ARC) material for a KrF excimer laser, an ArF excimer laser, or other light sources.

The anti-reflection film 110 may be formed to have a thickness ranging from, but is not limited to, about 20 nm to about 500 nm.

A width or a critical dimension (CD) of each of pillar-shaped guides PG1 that will be explained with reference to FIGS. 3A and 3B in a subsequent process may be determined by a width W1 of each of the plurality of holes 112H formed in the third mask pattern 112. The plurality of holes 112H formed in the third mask pattern 112 may be regularly arranged. For example, the plurality of holes 112H may be arranged in a hexagonal array or a matrix array.

The third mask pattern 112 may be formed of a photoresist. In example embodiments, the third mask pattern 112 may be formed of a resist for a KrF excimer laser (with wavelengths of 248 mm), a resist for an ArF excimer laser (with wavelengths of 193 nm), a resist for a $F_2$ excimer laser (with wavelengths of 157 nm), or a resist for an extreme ultraviolet (EUV) (with wavelengths of 13.5 nm).

Figure 2B:
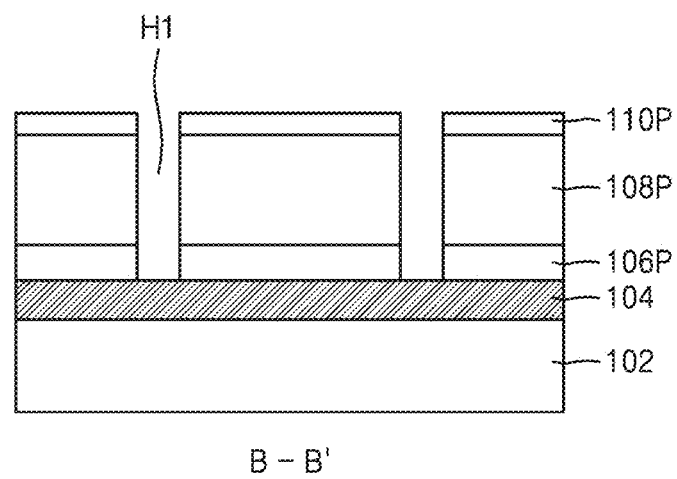

Referring to FIGS. 2A and 2B, a second mask pattern 108P and an anti-reflection pattern 110P are formed by etching the anti-reflection film 110 and the second mask layer 108 using the third mask pattern 112 (see FIGS. 1A and 1B) as an etch mask, and a first mask pattern 106P is formed by etching the first mask layer 106 using the second mask pattern 108P as an etch mask. As a result, a plurality of guide forming holes H1 that pass through the first mask pattern 106P and the second mask pattern 108P are formed.

The plurality of guide forming holes H1 may be regularly formed. For example, the plurality of guide forming holes H1 may be formed to be arranged in a hexagonal array or a matrix array.

After the plurality of guide forming holes H1 are formed, a top surface of the anti-reflection pattern 110P may be exposed by removing unnecessary films.

Figure 3A:
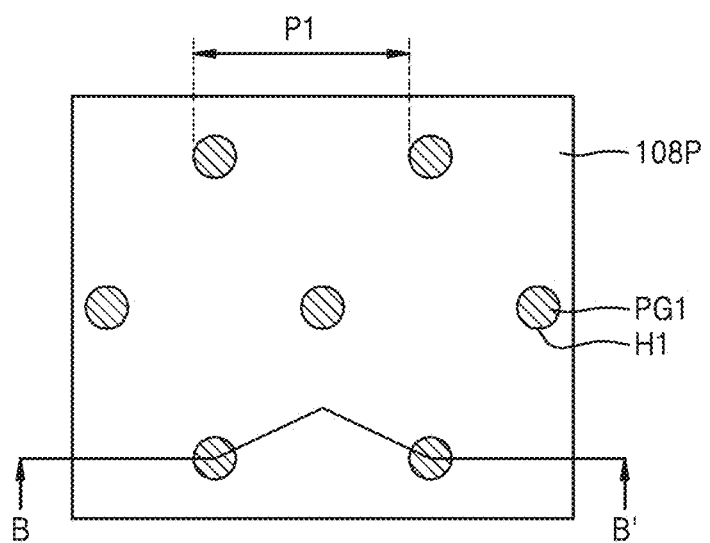
Figure 3B:
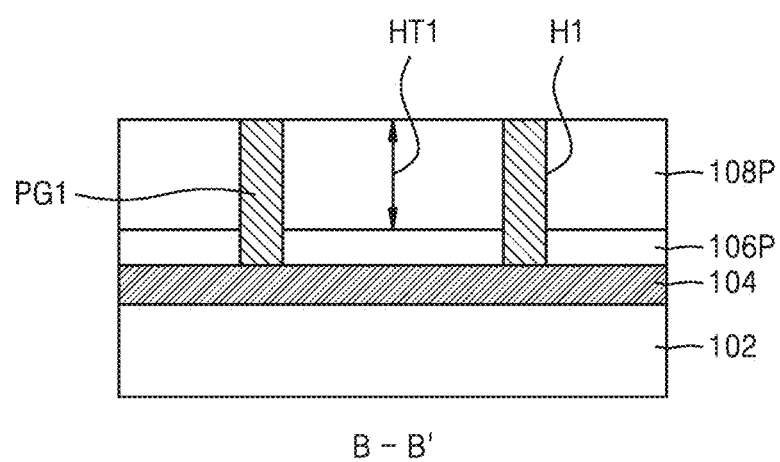

Referring to FIGS. 3A and 3B, the plurality of pillar-shaped guides PG1 are formed in the plurality of guide forming holes H1.

In example embodiments, in order to form the plurality of pillar-shaped guides PG1, a guide-forming material may be deposited to cover the top surface of the anti-reflection pattern and to fill the plurality of guide forming holes H1, and an unnecessary portion of the deposited guide-forming material may be removed using an etch-back process or a polishing process to make the deposited guide-forming material remain only in the plurality of guide forming holes H1. Since the anti-reflection pattern 110P may also be removed while the unnecessary portion of the guide-forming material is removed, a top surface of the second mask pattern 108P may be exposed around the plurality of pillar-shaped guides PG1.

The plurality of pillar-shaped guides PG1 protrude upward beyond the first mask pattern 106P. The plurality of pillar-shaped guides PG1 may be formed of a material including Si. In example embodiments, the plurality of pillar-shaped guides PG1 may be formed of silicon oxide. In example embodiments, in order to form the plurality of pillar-shaped guides PG1, an atomic layer deposition (ALD) or chemical vapour deposition (CVD) process may be performed on the guide-forming material.

In example embodiments, the plurality of pillar-shaped guides PG1 may be formed to have a diameter that is about 0.5 times to about 1.5 times a bulk period $L_0$ of a block copolymer layer 120 that will be explained with reference to FIGS. 5A and 5B. To this end, the width W1 of each of the plurality of holes 112H formed in the first mask pattern 112 of FIGS. 1A and 1B and a width of each of the plurality of guide forming holes H1 of FIGS. 2A and 2B may be adjusted.

Figure 5A:
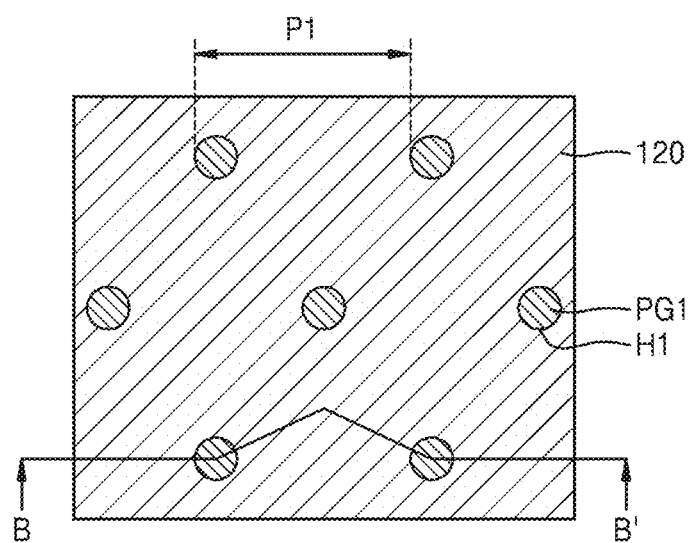
Figure 5B:
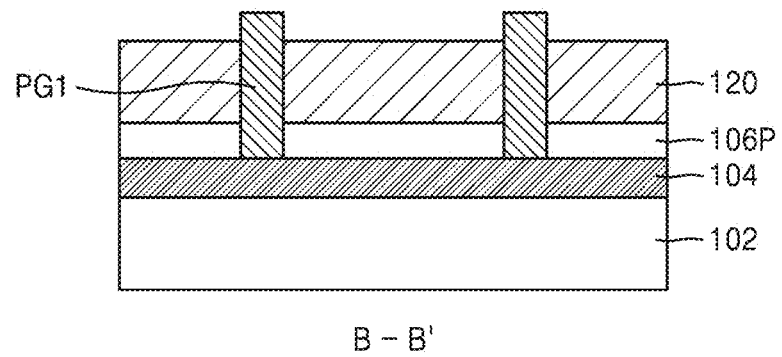

The plurality of pillar-shaped guides PG1 may be formed to have a first pitch P1 that is at least 1.5 times the bulk period $L_0$ of the block copolymer layer 120 of FIGS. 5A and 5B. To this end, the plurality of pillar-shaped guides PG1 may be formed so that a pitch of the plurality of holes 112H formed in the first mask pattern of FIGS. 1A and 1B and a pitch of the plurality of guide forming holes H1 of FIGS. 2A and 2B are each at least 1.5 times the bulk period $L_0$ of the block copolymer layer 120.

In example embodiments, the plurality of pillar-shaped guides PG1 may be formed to be arranged in a hexagonal array having the first pitch P1 that is 1.73 times the bulk period $L_0$ of the block copolymer layer 120. In this case, as will be described with reference to FIGS. 6A and 6B, a plurality of first domains 120A that are formed due to a phase separation process of the block copolymer layer 120 may be self-aligned in a cylindrical shape at a central portion between three pillar-shaped guides PG1 that are adjacent to one another from among the plurality of pillar-shaped guides PG1.

Figure 13A:
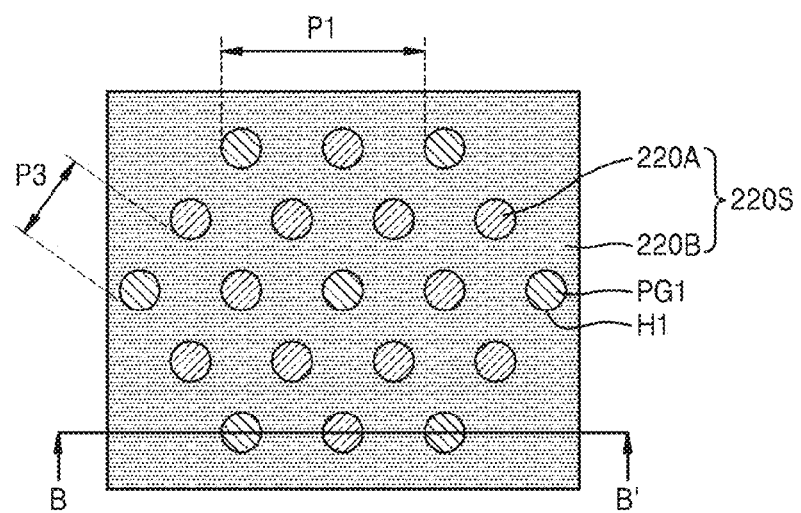
Figure 13B:
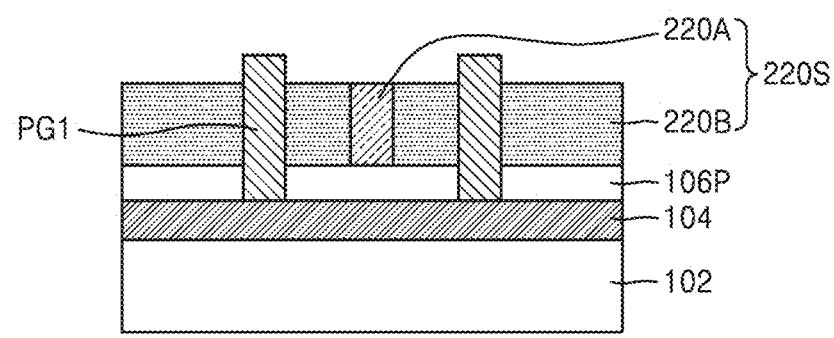

In example embodiments, the plurality of pillar-shaped guides PG1 may be formed to be arranged in a hexagonal array having the first pitch P1 that is N times (N is an integer equal to or greater than 2) the bulk period $L_0$ of the block copolymer layer 120. For example, the plurality of pillar-shaped guides PG1 may have the first pitch P1 that is 2 times the bulk period $L_0$ of the block copolymer layer 120. In this case, as shown in FIGS. 13A and 13B, a plurality of first domains 220A that are formed due to a phase separation process of the block copolymer layer 120 may be self-aligned in a cylindrical shape at a central portion between two pillar-shaped guides PG1 that are adjacent to each other from among the plurality of pillar-shaped guides PG1.

A height HT1 of each of portions of the plurality of pillar-shaped guides PG1 that protrude upward beyond the first mask pattern 106P may range from, but is not limited to, about 10 nm to about 500 nm.

Figure 4A:
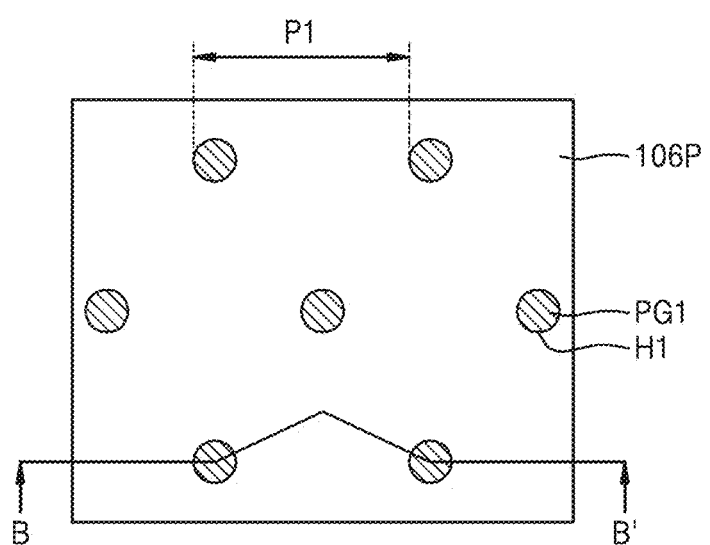
Figure 4B:
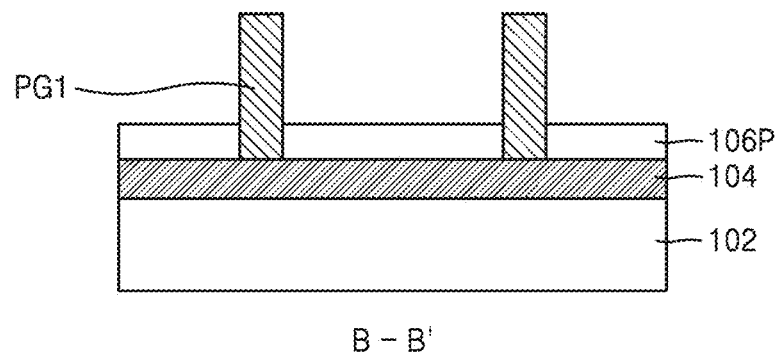

Referring to FIGS. 4A and 4B, a top surface of the first mask pattern 106P and top surfaces and side walls of the plurality of pillar-shaped guides PG1 are exposed by removing the second mask pattern 108P (see FIGS. 3A and 3B).

In example embodiments, when the second mask pattern 108P is formed of an SOH material, an ashing or stripping process may be used in order to remove the second mask pattern 108P.

Referring to FIGS. 5A and 5B, the block copolymer layer 120 formed of a ternary blend including a pure block copolymer including a first polymer block that has a first repeat unit and a second polymer block that has a second repeat unit, a first homopolymer, and a second homopolymer is formed around the plurality of pillar-shaped guides PG1 on the first mask pattern 106P.

The first homopolymer may have the same repeat unit as the first repeat unit of the first polymer block. The second homopolymer may have the same repeat unit as the second repeat unit of the second polymer block.

The pure block copolymer may be a block copolymer in which the first polymer block and the second polymer block are covalently bonded to each other at a volume ratio of 1:1. The block copolymer may include linear or branched polymers having a molecular weight ranging from about 3,000 g/mol to about 2,000,000 g/mol.

In the pure block copolymer, the first polymer block may be poly(methyl methacrylate) (PMMA), poly(ethylene oxide) (PEO), poly(lactic acid) (PLA), or polyisoprene (PI). The second polymer block may be polystyrene (PS). In example embodiments, when the pure block copolymer is a block copolymer formed of PMMA and PS, the first homopolymer may be PMMA and the second homopolymer may be PS.

A molecular weight of each of the first homopolymer and the second homopolymer may be equal to or less than ½ of a molecular weight of the pure block copolymer. In example embodiments, each of the first homopolymer and the second homopolymer may have a molecular weight that ranges from about 1000 g/mol to about 10000 g/mol.

Since not only the pure block copolymer but also the first homopolymer and the second homopolymer are included in the block copolymer layer 120, when the block copolymer layer 120 is rearranged through phase separation in a subsequent process and a self-assembled structure is formed on the first mask-pattern 106P, a time taken to form the self-assembled structure may be reduced and phase separation efficiency may be improved. In example embodiments, a pitch of the self-assembled structure obtained after the phase separation may be controlled by adjusting molecular weights of the first homopolymer and the second homopolymer included in the block copolymer layer 120. For example, as the molecular weights of the first homopolymer and the second homopolymer increase, the pitch of the self-assembled structure may increase. Accordingly, the self-assembled structure having a desired pitch may be formed by adjusting contents and the molecular weights of the first homopolymer and the second homopolymer.

In example embodiments, in order to form the block copolymer layer 120, a polymer blend in which the pure block copolymer and the first and second homopolymers are mixed with each other at a weight ratio that ranges from about 50:50 to about 95:5 may be applied to the first mask pattern 106P. For example, the block copolymer layer 120 may be formed using a dip coating, solution casting, or spin-coating process.

In example embodiments, a volume ratio between the first polymer block and the second polymer block in the pure block copolymer may range from about 20:80 to about 40:60.

In example embodiments, a weight ratio between the first homopolymer and the second homopolymer in the polymer blend may range from about 30:70 to about 50:50.

Figure 6A:
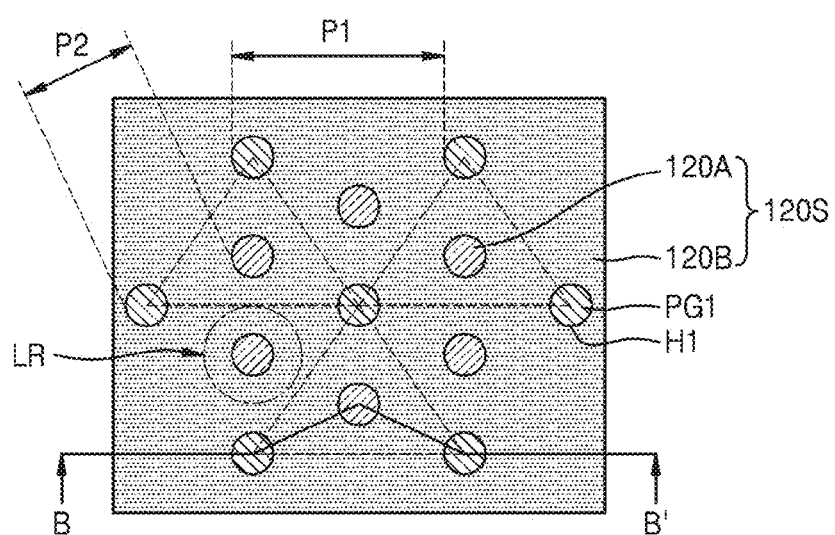
Figure 6B:
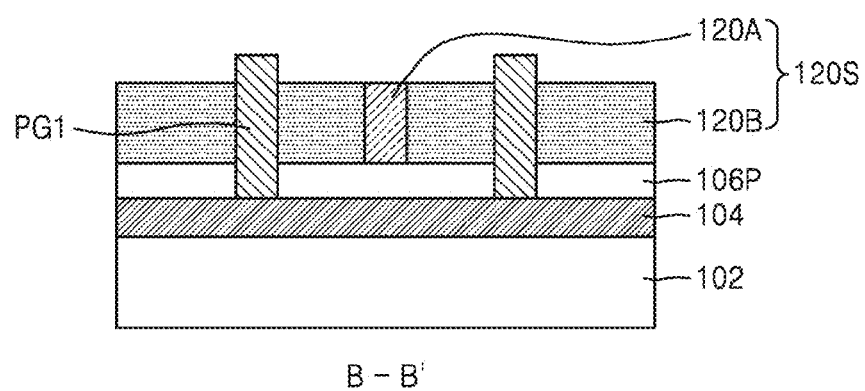

Referring to FIGS. 6A and 6B, a self-assembled layer 120S including the plurality of first domains 120A including the first polymer block and the first homopolymer and a second domain 120B that includes the second polymer block and the second homopolymer and surrounds the plurality of pillar-shaped guides PG1 and the plurality of first domains 120A is formed by phase separating the block copolymer layer 120 (see FIGS. 5A and 5B).

In order to phase separate the block copolymer layer 120, the block copolymer layer 120 may be annealed at a temperature higher than a glass transition temperature Tg of a block copolymer in the block copolymer layer 120. For example, in order to phase separate the block copolymer layer 120, the block copolymer layer 120 may be annealed for about 1 hour to 24 hours at a temperature ranging from about 130° C. to about 190° C.

The plurality of first domains 120A may be regularly arranged along with the plurality of pillar-shaped guides PG1. For example, a hexagonal array having a second pitch P2 that is less than the first pitch P1 may be achieved due to the plurality of first domains 120a and the plurality of pillar-shaped guides PG1.

In FIGS. 6A and 6B, the plurality of first domains 120A are self-aligned in a cylindrical shape at a central portion of a triangle formed by three pillar-shaped guides PG1 that are adjacent to one another from among the plurality of pillar-shaped guides PG1.

Figure 11:
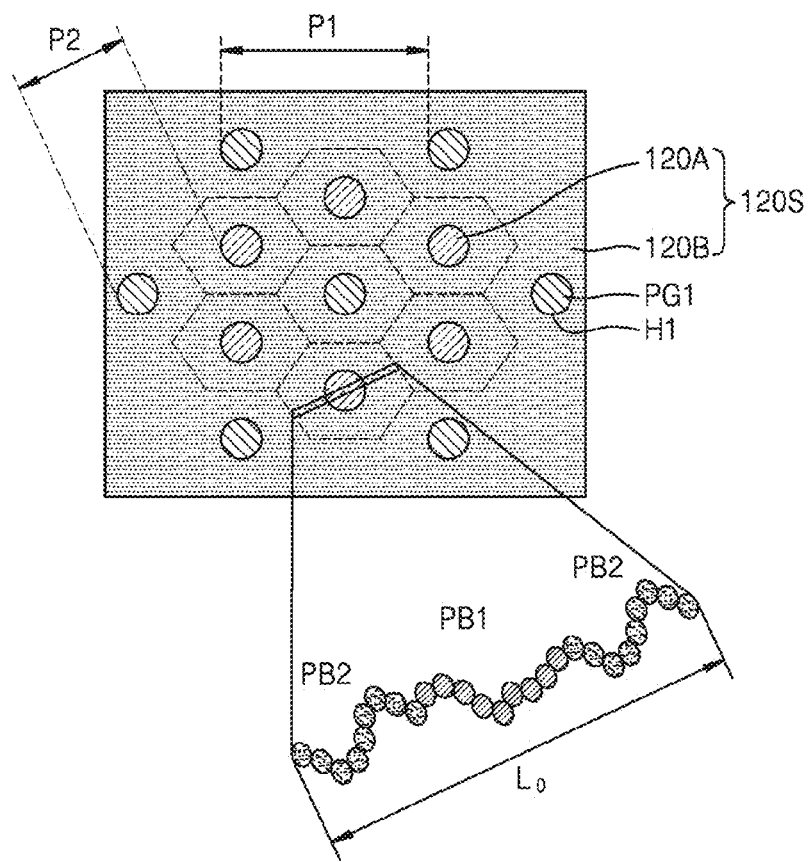
FIG. 11 is a detailed plan view for explaining first domain and a second domain formed using a method of forming a fine pattern, according to example embodiments.

FIG. 11 is a detailed plan view for explaining the plurality of first domains 120A and the second domain 120B that surrounds the plurality of first domains 120A, included in the self-assembled layer 120S of FIGS. 6A and 6B, according to example embodiments.

A linked structure between a first polymer block PB1 included in each of the plurality of first domains 120A and a second polymer block PB2 included in the second domain 120B in the self-assembled layer 120S is illustrated in FIG. 11. The bulk period $L_O$ that is determined in the linked structure between the first polymer block PB1 and the second polymer block PB2, that is, the bulk period $L_O$ corresponding to a unique pitch that is a repeat unit of the self-assembled structure obtained as a result of self-assembling of the block copolymer layer 120, may range from about 40 nm to about 60 nm.

In example embodiments, as shown in FIGS. 6A and 6B, in order for the plurality of first domains 120A to be self-aligned in a cylindrical shape at a central portion of a triangle formed by three pillar-shaped guides PG1 that are adjacent to one another from among the plurality of pillar-shaped guides PG1, the plurality of pillar-shaped guides PG1 of FIGS. 3A and 3B may be formed to be arranged in a hexagonal array having the first pitch P1 that is about 1.73 times the bulk period $L_O$ of the block copolymer layer 120.

In example embodiments, due to phase separation of the block copolymer layer 120 of FIGS. 5A and 5B, as shown in FIGS. 13A and 13B, a self-assembled layer 220S including the plurality of first domains 220A that are self-aligned in a cylindrical shape at a central portion between two pillar-shaped guides PG1 that are adjacent to each other from among the plurality of pillar-shaped guides PG1 and a second domain 220B that surrounds the plurality of pillar-shaped guides PG1 and the plurality of first domains 220A may be formed. To this end, the plurality of pillar-shaped guides PG1 of FIGS. 3A and 3B may be formed to be arranged in a hexagonal array having the first pitch P1 that is about 2 times the bulk period $L_O$ of the block copolymer layer 120. In this case, the plurality of first domains 220A of FIGS. 13A and 13B may be regularly arranged along with the plurality of pillar-shaped guides PG1. For example, due to the plurality of first domains 220A and the plurality of pillar-shaped guides PG1, a hexagonal array having a third pitch P3 that is less than the first pitch P1 may be achieved.

Figure 12:
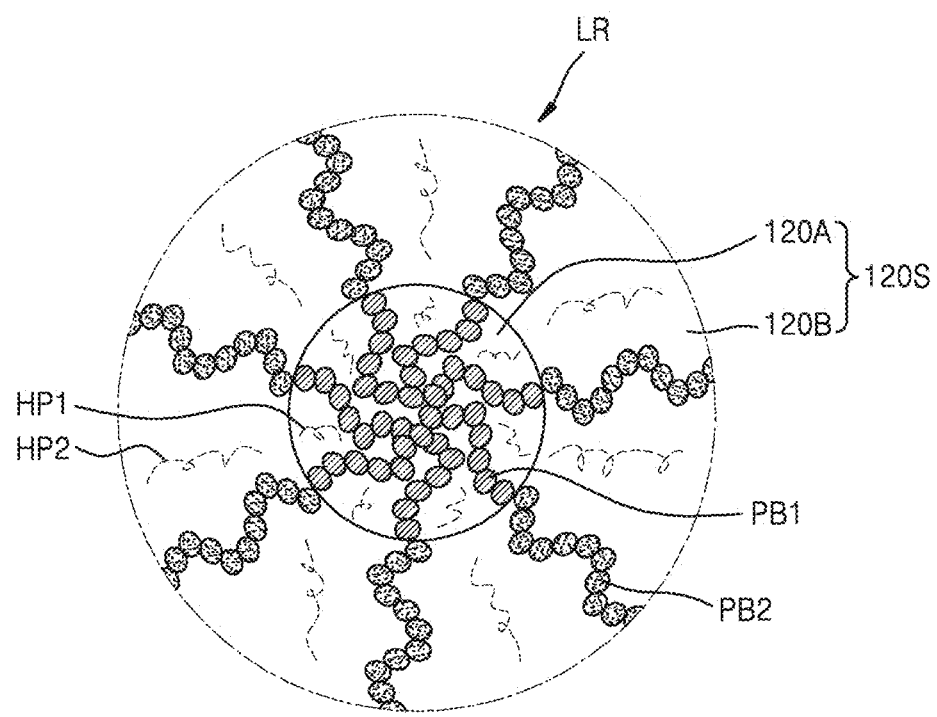
FIG. 12 is a schematic view illustrating a self-assembled structure of polymers formed using a method of forming a fine pattern, according to example embodiments.

FIG. 12 is a schematic view illustrating a self-assembled structure of polymers included in a local region LR that is marked by a dash-dot line in the self-assembled layer 120S that is obtained as a result of a phase separation process of FIGS. 6A and 6B, according to example embodiments.

As shown in FIG. 12, the first polymer block PB1 and a first homopolymer HP1 are included in each of the first domains 120A, and the second polymer block PB2 and a second homopolymer HP2 are included in the second domain 120B that surrounds the first domains 120A. In example embodiments, each of the first polymer block PB1 and the first homopolymer HP1 may be PMMA, PEO, PLA, or PI, and each of the second polymer block PB2 and the second homopolymer HP2 may be PS.

After self-assembling is performed due to phase separation of the pure block copolymer including the first polymer block PB1 and the second polymer block PB2, the first homopolymer HP1 having a relatively small molecular weight may be self-assembled in a space between units of the first polymer block PB1 in the first domain 120A, and the second homopolymer PH2 having a relatively small molecular weight may be self-assembled in a space between units of the second polymer block PB2 in the second domain 120B. As such, since the block copolymer layer 120 that is formed of a blend including the pure block copolymer and the first and second homopolymers HP1 and HP2 each having a relatively small molecular weight is phase separated, low molecular weight effect may be gained from the block copolymer layer 120 and chain mobility due to heat of polymers in the block copolymer layer 120 may be improved, thereby improving phase separation effect of the block copolymer layer 120.

Figure 7A:
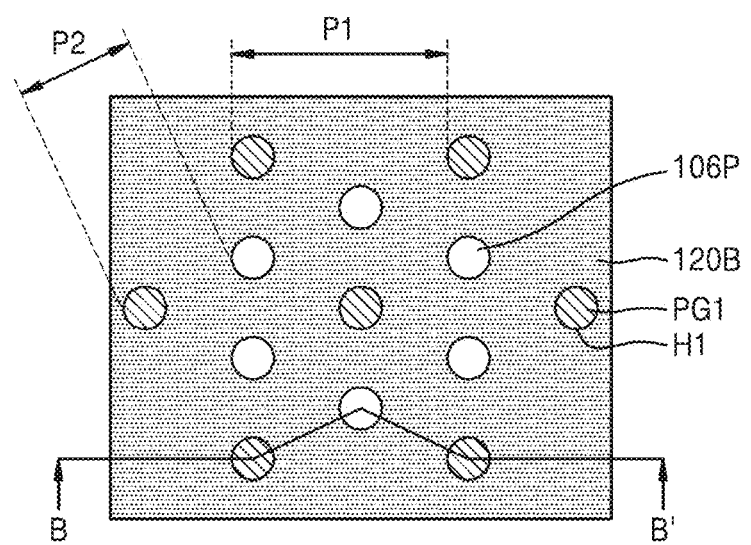
Figure 7B:
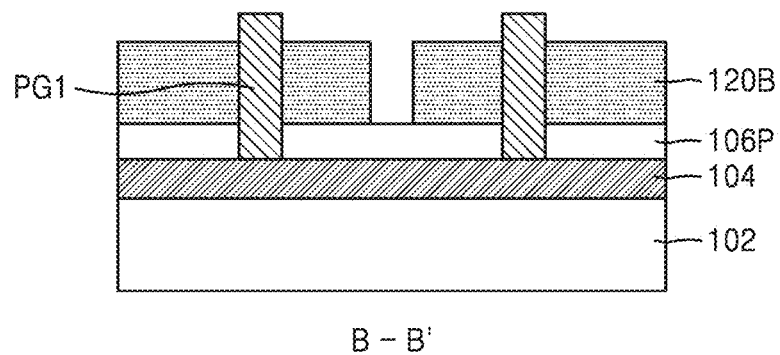

Referring to FIGS. 7A and 7B, the plurality of first domains 120A is removed from the self-assembled layer 120S (see FIGS. 6A and 6B).

In example embodiments, in order to selectively remove only the plurality of first domains 120A from the self-assembled layer 120S, the plurality of first domains 120A may be selectively decomposed by applying a polymer decomposer to the self-assembled layer 120S and a process of stripping the decomposed first domains 120A may be performed using a cleaning fluid, e.g., isopropyl alcohol (IPA). In example embodiments, radiant rays or plasma may be used as the polymer decomposer. The radiant rays may be applied in an oxygen atmosphere, and may be deep ultraviolet (DUV) rays, soft X-rays, or E-beams. The plasma may be oxygen plasma. In order to selectively decompose the plurality of first domains 120A, a type or energy of the polymer decomposer may be selected. For example, the plurality of first domains 120A and the second domain 120B may have different threshold energy at which they start to be decomposed. Accordingly, radiant rays or plasma having energy that may selectively decompose only the plurality of first domains 120A from among the plurality of first domains 120A and the second domain 120B may be applied to the self-assembled layer 120S. Radiant energy or plasma energy may be adjusted using a time for which the radiant rays are applied or a time for which the plasma is exposed.

Figure 8A:
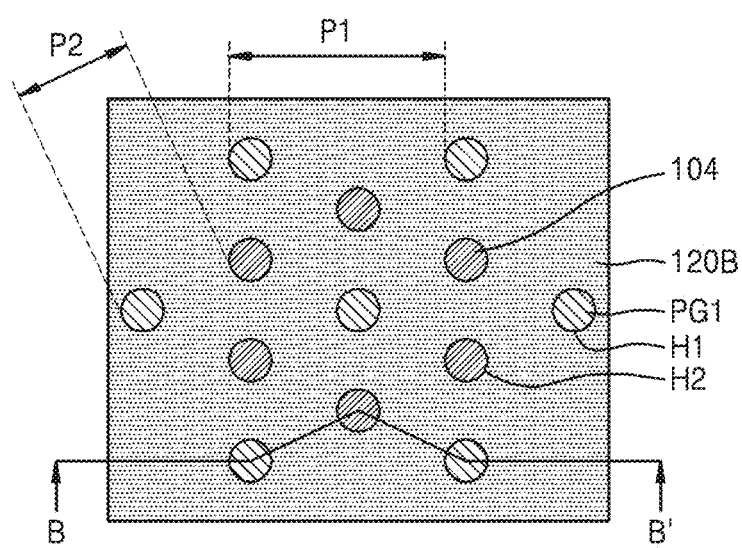
Figure 8B:
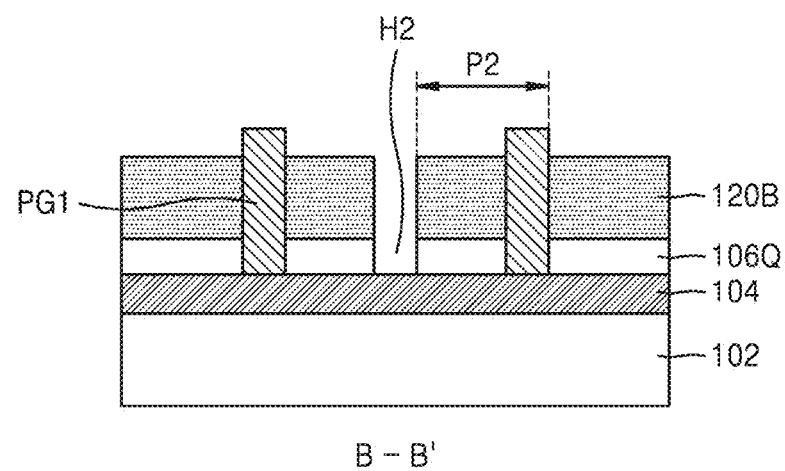

Referring to FIGS. 8A and 8B, a first mask pattern 106Q in which a plurality of self-assembled holes H2 corresponding to the plurality of first domains 120A are formed is formed by etching the first mask pattern 106P (see FIGS. 7A and 7B) using the plurality of pillar-shaped guides PG1 and the second domain 120B as etch masks.

Figure 9A:
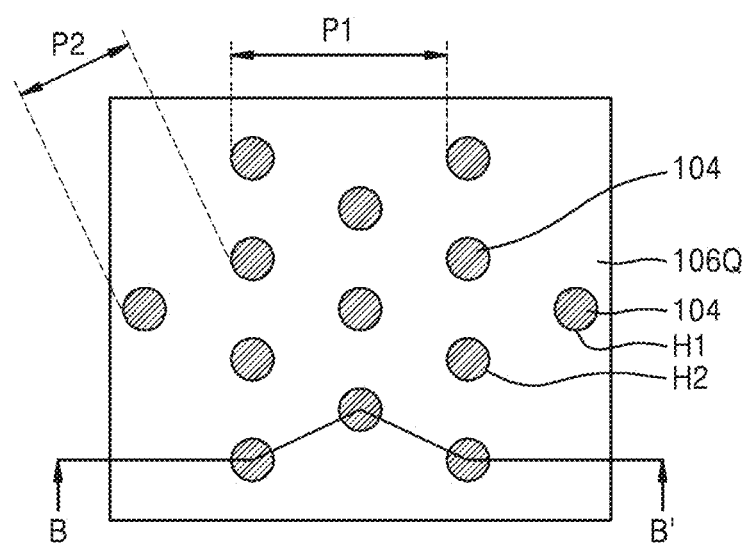
Figure 9B:
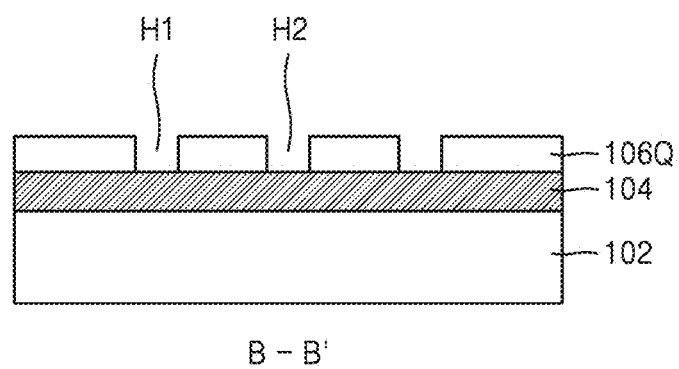

Referring to FIGS. 9A and 9B, a top surface of the first mask pattern 106Q is exposed by removing the plurality of pillar-shaped guides PG1 and the second domain 120B remaining on the first mask pattern 106Q.

The etch film 104 may be exposed through the plurality of self-assembled holes H2 and the plurality of guide forming holes H1 formed in the first mask pattern 106Q.

Figure 10A:
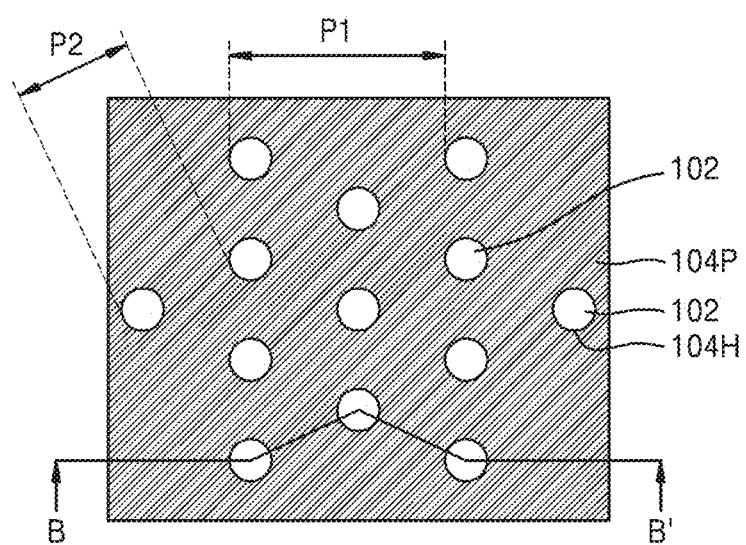
Figure 10B:
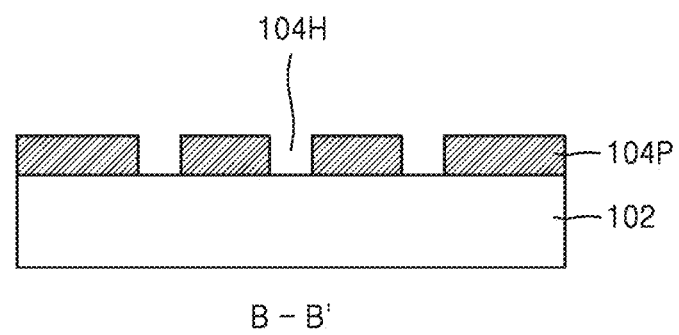

Referring to FIGS. 10A and 10B, a fine pattern 14P in which a plurality of holes 104H are formed is formed by etching portions of the etch film 104 that are exposed through the plurality of guide forming holes H1 and the plurality of self-assembled holes H2 using the first mask pattern 106Q (see FIGS. 9A and 9B) as an etch mask.

A top surface of the fine pattern 104P is exposed by removing unnecessary films remaining on the fine pattern 104P.

The method of forming a fine pattern described with reference to FIGS. 1A through 10B involves forming, around the plurality of pillar-shaped guides PG1 on the first mask pattern 106P, the block copolymer layer 120 made of a ternary blend including the pure block copolymer including the first polymer block PB1 that has the first repeat unit and the second polymer block PB2 that has the second repeat unit, and the first homopolymer HP1 and the second homopolymer HP2 each having a relatively small molecular weight, and forming a fine pattern by phase separating the block copolymer layer 120. When the block copolymer layer 120 is phase separated, low molecular weight effect is gained from the block copolymer layer 120 due to the first homopolymer HP1 and the second homopolymer HP2 each having a relatively small molecular weight which constitute the block copolymer layer 120 along with the pure block copolymer and chain mobility due to heat of polymers in the block copolymer layer 120 is improved, thereby improving phase separation effect of the block copolymer layer 120. Accordingly, when a pattern that is necessary to manufacture a highly integrated semiconductor device exceeding a resolution limit in a photolithography process is formed, a plurality of hole patterns that are repeatedly formed at fine pitches may be easily formed.

FIGS. 14A through 14D are cross-sectional views according to a process order for explaining a method of forming a fine pattern, according to example embodiments. In FIGS. 14A through 14D, the same elements as those in FIGS. 1A through 10B are denoted by the same reference numerals, and a detailed explanation thereof will not be given for brevity.

Figure 14A:
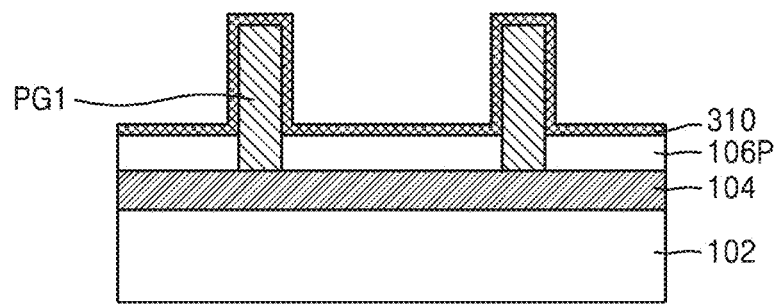
FIGS. 14A through 14D are cross-sectional views according to a process order for explaining a method of forming a fine pattern, according to example embodiments.

Referring to FIG. 14A, like in FIGS. 1A through 4B, the plurality of pillar-shaped guides PG1 that protrude upward beyond the first mask pattern 106P on the substrate 102 are formed, and then an organic liner 310 that covers an exposed surface of the first mask pattern 106P and exposed top surfaces and side walls of the plurality of pillar-shaped guides PG1 is formed.

In example embodiments, the organic liner 310 may include a material having a higher affinity for the second polymer block PB2 than for the first polymer block PB1 from among constituent materials of the block copolymer layer 120 of FIGS. 5A through 6B and FIGS. 11 and 12.

In example embodiments, the organic liner 310 may be a neutral organic liner whose affinity for the first polymer block PB1 and whose affinity for the second polymer block PB2 are similar to each other from among constituent materials of the block copolymer layer 120. In example embodiments, the organic liner 310 may include a random copolymer including a first block that has the same repeat unit as the first repeat unit of the first polymer block PB1, a second block that has the same repeat unit as the second repeat unit of the second polymer block PB2, and a third block that has a repeat unit including a primary hydroxyl group. The third block may be obtained from a monomer unit, e.g., 2-hydroxyethyl methacrylate, 3-hydroxypropyl methacrylate, or 4-hydroxybutyl methacrylate. In the random copolymer, the third block may be included in the random copolymer in an amount that ranges from about 0.01 weight % to about 10 weight % based on a total weight of the random copolymer.

In example embodiments, in order to form the organic liner 310, a process of attaching the random copolymer to the exposed surfaces of the plurality of pillar-shaped guides PG1 and the exposed surface of the first mask pattern 106P may be performed using the primary hydroxyl group of the third block as an anchoring group.

In example embodiments, in order to form the organic liner 310, a random copolymer composition including the random copolymer may be coated on the exposed surfaces of the plurality of pillar-shaped guides PG1. The primary hydroxyl group of the third block and a pillar core may be helped to react with each other by heat-treating the random copolymer composition coated on the exposed surfaces of the plurality of pillar-shaped guides PG1 and the exposed surface of the first mask pattern 106P so that the random copolymer is attached to the exposed surfaces of the plurality of pillar-shaped guides PG1 and the exposed surface of the first mask pattern 106P. The heat treatment may be performed, but is not limited to, for about 60 seconds to about 300 seconds at a temperature ranging from about 150° C. to about 300° C. A non-reacted portion of the random copolymer composition may be removed using an organic solvent to expose the organic liner 310 that covers the exposed surfaces of the plurality of pillar-shaped guides PG1 and the exposed surface of the first mask pattern 106P. The organic solvent may be, but is not limited to, propylene glycol monomethyl ester acetate (PGMEA), propylene glycol monomethyl ester (PGME), ethyl-3-ethoxy propionate (EEP), ethyl lactate (EL), methyl 2-hydroxybutyate (HBM), or gamma-butyro lactone (GBL).

Since the random copolymer includes the third block having the primary hydroxyl group, assuming that the plurality of pillar-shaped guides PG1 are formed of a silicon oxide film, when the random copolymer are coated on the surfaces of the plurality of pillar-shaped guides PG1 and then are heat-treated, the random copolymer including the third block may be attached to surfaces of the plurality of pillar-shaped guides PG1 due to condensation reaction between silanol of the plurality of pillar-shaped guides PG1 and the primary hydroxyl group of the third block. When random copolymers that do not react and remain around the plurality of pillar-shaped guides PG1 are stripped using an organic solvent to be removed, the organic liner 310 having a predetermined or given thickness may remain on the surfaces of the plurality of pillar-shaped guides PG1 and the plurality of pillar-shaped guides PG1 whose surface characteristics are changed due to the organic liner 310 may be obtained. When the random copolymers that are used to form the organic liner 310 include a styrene monomer and a methyl methacrylate monomer, the organic liner 310 may have PMMA affinity, PS affinity, or neutral characteristics for constituent materials, for example, PMMA and PS, of the block copolymer layer 120 that is formed around the plurality of pillar-shaped guides PG1 in a subsequent process by adjusting a ratio between the styrene monomer and the methyl methacrylate monomer. For example, once the organic liner 310 is formed to have neutral characteristics or PS affinity, after the block copolymer layer 120 is phase separated, an undesired PMMA domain may be prevented or inhibited from remaining in a ring shape or a discontinuous ring shape around the plurality of pillar-shaped guides PG1.

In example embodiments, the organic liner 310 may be formed to have a thickness that ranges from about 2 nm to about 15 nm.

Figure 14B:
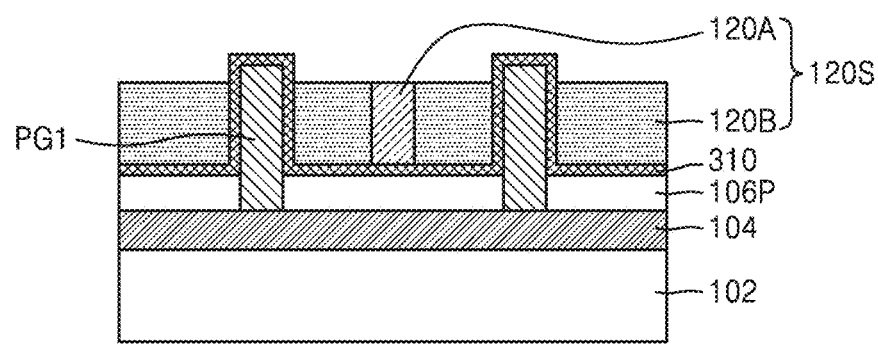

Referring to FIG. 14B, like in FIGS. 5A and 5B, the block copolymer layer 120 formed of a ternary blend including the pure block copolymer including the first polymer block that has the first repeat unit and the second polymer block that has the second repeat unit, the first homopolymer, and the second homopolymer is formed around the plurality of pillar-shaped guides PG1 on the first mask pattern 106P with the organic liner 310 therebetween.

Like in FIGS. 6A and 6B, the self-assembled layer 120S including the plurality of first domains 120A that include the first polymer block and the first homopolymer and the second domain 120B that includes the second polymer block and the second homopolymer and surrounds the plurality of pillar-shaped guides PG1 and the plurality of first domains 120A is formed by phase separating the block copolymer layer 120.

Figure 14C:
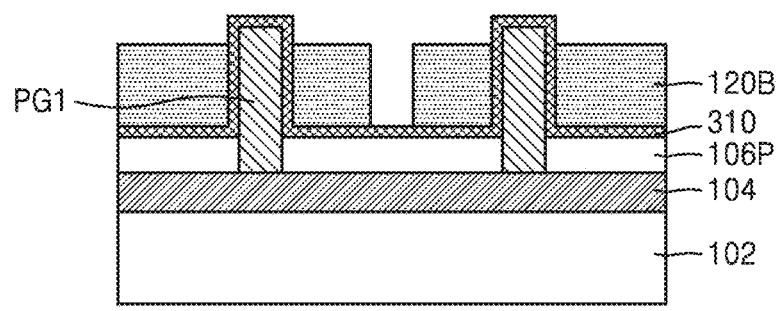

Referring to FIG. 14C, like in FIGS. 7A and 7B, the plurality of first domains 120A are removed from the self-assembled layer 120S (see FIG. 14B).

Figure 14D:
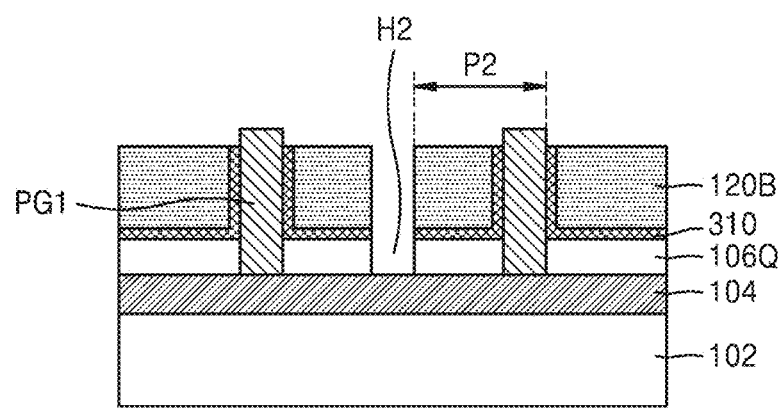

Referring to FIG. 14D, like in FIGS. 8A and 8B, the first mask pattern 106Q in which the plurality of self-assembled holes H2 are formed is formed on the first mask pattern 106P by etching the first mask pattern 106P (see FIG. 14C) and an exposed portion of the organic liner 310 using the plurality of pillar-shaped guides PG1 and the second domain 120B as etch masks. The plurality of self-assembled holes H2 may be arranged to correspond to the first domains 120A.

Like in FIGS. 9A through 10B, a fine pattern may be formed from the etch film 104.

According to the method of forming a fine pattern described with reference to FIGS. 14A through 14D, defects or malfunctions that may occur when the plurality of pillar-shaped guides PG1 have hydrophilic properties may be prevented or inhibited. For example, when the block copolymer layer 120 is phase separated, due to the hydrophilic properties of the plurality of pillar-shaped guides PG1, the first polymer block and/or the first homopolymer, for example, a PMMA domain, may undesirably remain in a ring shape or discontinuous ring shape around the plurality of pillar-shaped guides PG1. However, defects having such a ring or discontinuous ring shape may be prevented or inhibited by forming the organic liner 310 on surfaces of the plurality of pillar-shaped guides PG1 to change surface characteristics of portions of the plurality of pillar-shaped guides PG1 that contact the block copolymer layer 120. That is, defects may be prevented or inhibited from occurring around the plurality of pillar-shaped guides PG1 and phase separation of the block copolymer layer 120 may be effectively performed by forming the organic liner 310 having a higher surface affinity for the second polymer block than for the first polymer block on surfaces of the plurality of pillar-shaped guides PG1 or forming the organic liner 310 having neutral characteristics so that an affinity for the first polymer block and an affinity for the second polymer block are similar to each other.

FIGS. 15A through 15L are cross-sectional views according to a process order for explaining a method of forming a fine pattern, according to example embodiments.

The method of forming a fine pattern including a process of forming pillar-shaped guides having a different structure from the pillar-shaped guides PG1 of FIGS. 1A through 14D will be explained with reference to FIGS. 15A through 15L. In FIGS. 15A through 15L, the same elements as those of FIGS. 1A through 14D are denoted by the same reference numerals, and a detailed explanation thereof will not be given for brevity.

Figure 15A:
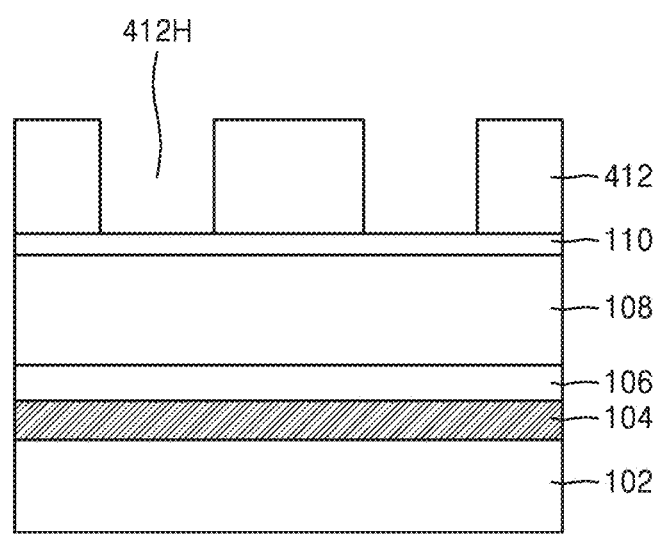
FIGS. 15A through 15L are cross-sectional views according to a process order for explaining a method of forming a fine pattern, according to example embodiments.

Referring to FIG. 15A, like in FIGS. 1A and 1B, the etch film 104 is formed on the substrate 102, and the first mask layer 106, the second mask layer 108, and the anti-reflection film 110 are sequentially formed on the etch film 104.

A third mask pattern 412 in which a plurality of holes 412H are formed is formed on the anti-reflection film 110.

The third mask pattern 412 is almost the same as the third mask pattern 112 of FIGS. 1A and 1B.

Figure 15B:
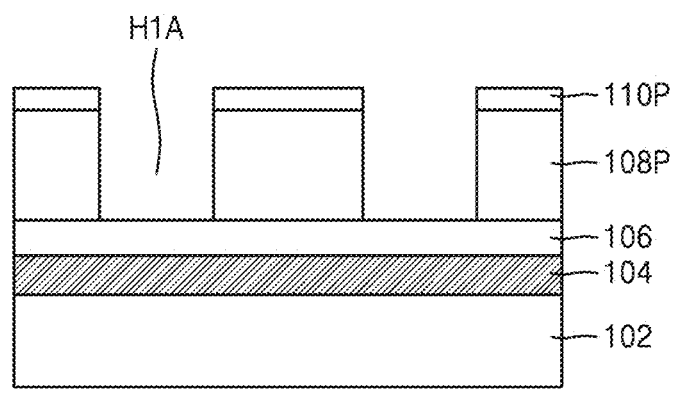

Referring to FIG. 15B, the second mask pattern 108P and the anti-reflection pattern 110P are formed by etching the anti-reflection film 110 and the second mask layer 108 using the third mask pattern 412 (see FIGS. 1A and 1B) as an etch mask. As a result, a plurality of guide forming holes H1A that pass through the second mask pattern 108P are formed.

After the plurality of guide forming holes H1A are formed, the third mask pattern 412 may be removed.

Figure 15C:
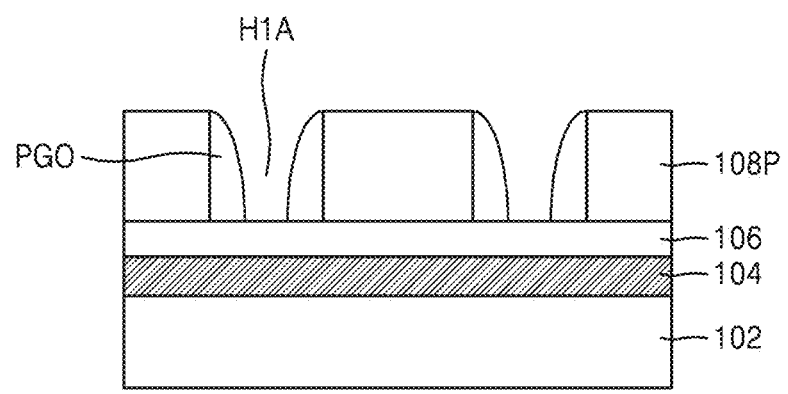

Referring to FIG. 15C, a plurality of pillar-shaped guide outer walls PGO that cover side walls of the second mask pattern 108P in the plurality of guide forming holes HIA are formed.

In example embodiments, in order to form the plurality of pillar-shaped guide outer walls PGO, a first material layer may be formed to cover inner walls of the plurality of guide forming holes H1A and a top surface of the second mask pattern 108P in a resultant structure of FIG. 15B, and then the plurality of pillar-shaped guide outer walls PGO may remain only on the side walls of the second mask pattern 108P in the plurality of guide forming holes H1A by etching back the first material layer. A process of etching back the first material layer may be performed until the top surface of the second mask pattern 108P is exposed. In this process, the anti-reflection pattern 110P that remains on the second mask pattern 108P may be removed.

In example embodiments, the pillar-shaped guide outer walls PGO may be formed of a material including Si, for example, silicon oxide.

Figure 15D:
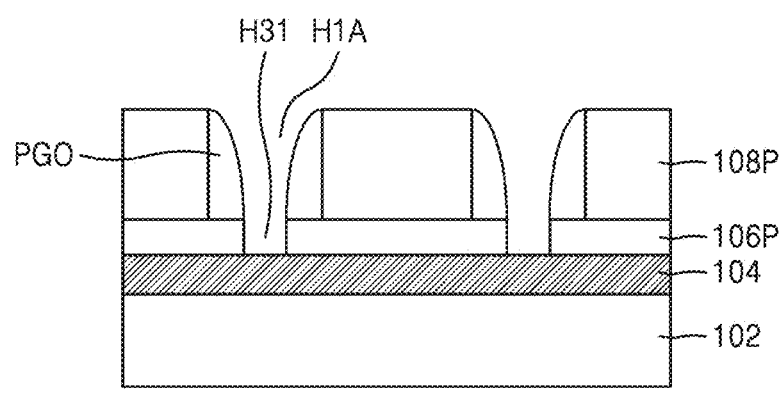

Referring to FIG. 15D, the first mask pattern 106P in which a plurality of first holes H31 are formed is formed by etching portions of the first mask layer 106 that are exposed through the plurality of guide forming holes HIA (see FIG. 15C) using the second mask pattern 108P and the plurality of pillar-shaped guide outer walls PGO as etch masks.

The plurality of guide forming holes H1A and the plurality of first holes H31 are used as a plurality of inner spaces for forming a plurality of pillar cores PGC that will be explained below.

Figure 15E:
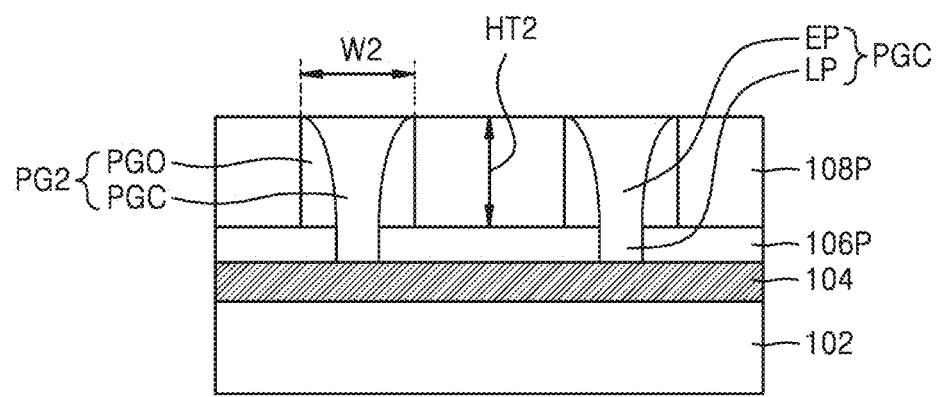

Referring to FIG. 15E, the plurality of pillar cores PGC that fill the plurality of first holes H31 and the plurality of guide forming holes HIA (see FIG. 15D) are formed, and a plurality of pillar-shaped guides PG2 including the plurality of pillar-shaped guide outer walls PGO and the plurality of pillar cores PGC are formed.

The plurality of pillar cores PGC include lower portions LP that fill the first holes H31 and extending portions EP that are integrally formed with the lower portions LP, fill inner spaces defined by the guide forming holes H1A, and protrude upward beyond the first mask pattern 106P.

In example embodiments, in order to form the plurality of pillar cores PGC, a second material layer having a thickness great enough to fill the plurality of first holes H31 and the plurality of guide forming holes H1A may be formed on the substrate 102, and then the plurality of pillar cores PGC may remain by etching back or planarizing the second material layer.

The plurality of pillar cores PGC may be formed of a material including Si, for example, silicon oxide. In example embodiments, the plurality of pillar cores PGC and the plurality of pillar-shaped guide outer walls PGO may be formed of the same material.

In example embodiments, like in FIGS. 3A and 3B, the plurality of pillar-shaped guides PG2 may be formed to be arranged in a hexagonal array having a pitch that is 1.7.3 times the bulk period $L_O$ of the block copolymer layer 120 that is formed around the plurality of pillar-shaped guides PG2 in a subsequent process. In this case, like in FIGS. 6A and 6B, the plurality of first domains 120A that are formed due to a phase separation process of the block copolymer layer 120 may be self-aligned in a cylindrical shape at a central portion between three pillar-shaped guides PG2 that are adjacent to one another from among the plurality of pillar-shaped guides PG2.

In example embodiments, the plurality of pillar-shaped guides PG2 may be formed to be arranged in a hexagonal array having the first pitch P1 that is N times (N is an integer equal to or greater than 2) the bulk period $L_o$ of the block copolymer layer 120. For example, the plurality of pillar-shaped guides PG2 may have the first pitch P1 that is two times the bulk period $L_o$ of the block copolymer layer 120. In this case, like in FIGS. 13A and 13B, the plurality of first domains 220A that are formed due to a phase separation process of the block copolymer layer 120 may be self-aligned in a cylindrical shape at a central portion between two pillar-shaped guides PG2 that are adjacent to each other from among the plurality of pillar-shaped guides PG2.

A height HT2 of each of portions of the plurality of pillar-shaped guides PG2 that protrude upward beyond the first mask pattern 106P may range from, but is not limited to, about 10 nm to about 500 nm.

Figure 15F:
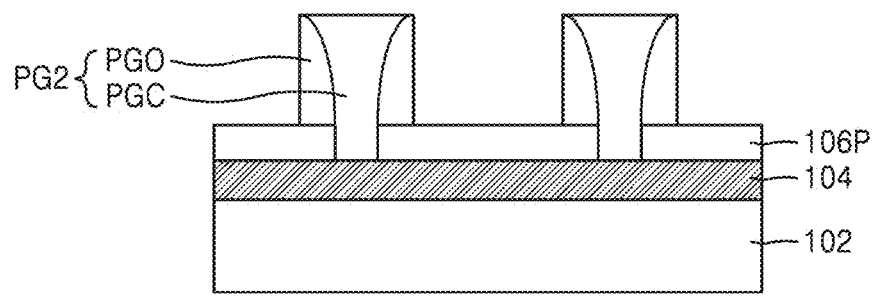

Referring to FIG. 15F, a top surface of the first mask pattern 106P and top surfaces and side walls of the plurality of pillar-shaped guides PG2 are exposed by removing the second mask pattern 108P (see FIG. 15E).

Figure 15G:
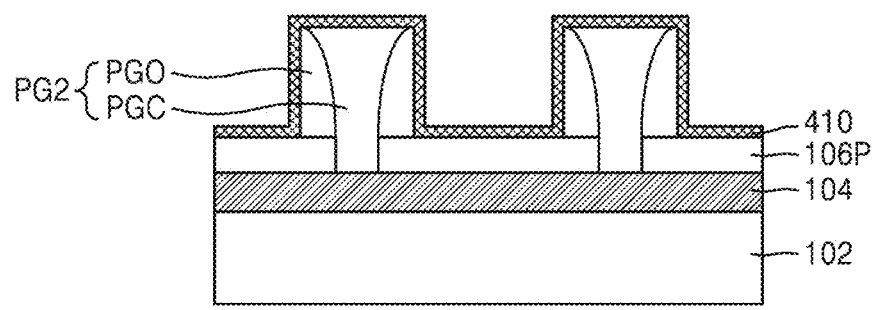

Referring to FIG. 15G, like in FIG. 14A, an organic liner 410 that covers the exposed surface of the first mask pattern 106P and the exposed top surfaces and side walls of the plurality of pillar-shaped guides PG2 is formed.

In example embodiments, the organic liner 410 may include a material having a higher affinity for the second polymer block PB2 than for the first polymer block PB1 from among constituent materials of the block copolymer layer 120 of FIGS. 5A through 6B, 11, and 12.

In example embodiments, the organic liner 410 may be a neutral organic liner whose affinity for the first polymer block PB1 and whose affinity for the second polymer block PB2 are similar to each other from among constituent materials of the block copolymer layer 120.

A detailed configuration of the organic liner 410 is the same as that of the organic liner 310 of FIG. 14A.

Figure 15H:
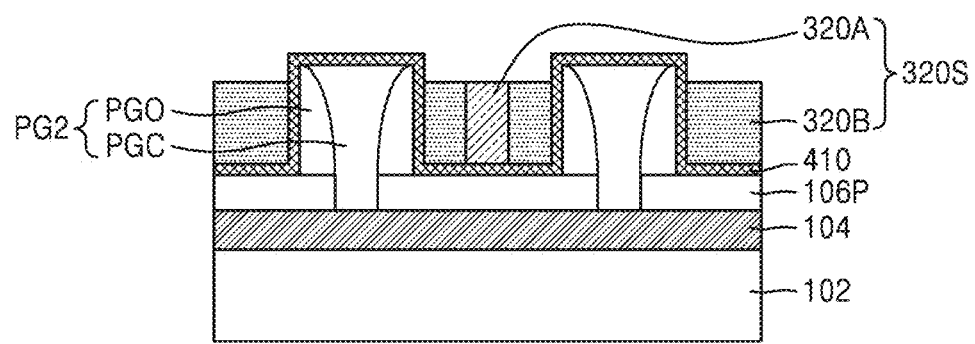

Referring to FIG. 15H, like in FIGS. 5A and 5B, the block copolymer 120 formed of a ternary blend including the pure block copolymer including the first polymer block that has the first repeat unit and the second polymer block that has the second repeat unit, the first homopolymer, and the second homopolymer is formed around the plurality of pillar-shaped guides PG2 on the first mask pattern 106P with the organic liner 410 therebetween, and like in FIGS. 6A and 6B, a self-assembled layer 320S including a plurality of first domains 320A that include the first polymer block and the first homopolymer and a second domain 320B that includes the second polymer block and the second homopolymer and surrounds the plurality of pillar-shaped guides PG2 and the plurality of first domains 320A is formed by phase separating the block copolymer layer 120.

Figure 15I:
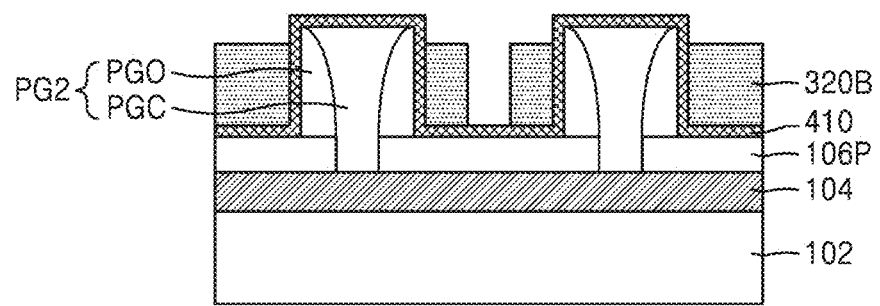

Referring to FIG. 15I, the plurality of first domains 320A are removed from the self-assembled layer 320S (see FIG. 15H).

Figure 15J:
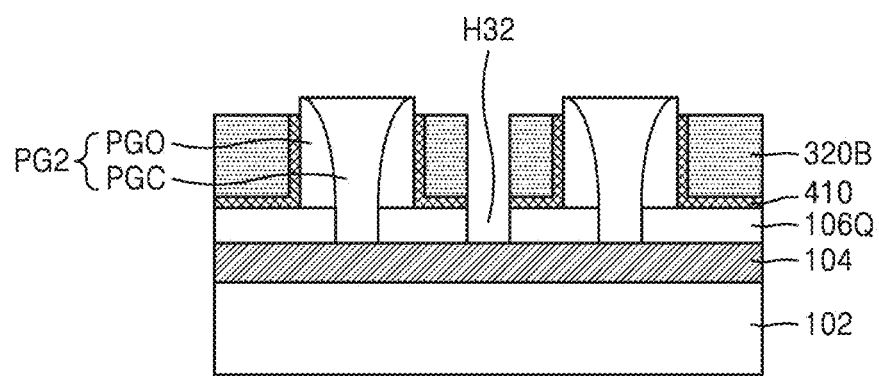

Referring to FIG. 15J, like in FIGS. 8A and 8B, the first mask pattern 106Q in which a plurality of self-assembled holes H32 are formed is formed in place of the first mask pattern 106P by etching the first mask pattern 106P (see FIG. 14C) using the plurality of pillar-shaped guides PG2 and the second domain 320B as etch masks. The plurality of self-assembled holes H32 may be arranged to correspond to the plurality of first domains 320A.

Figure 15K:
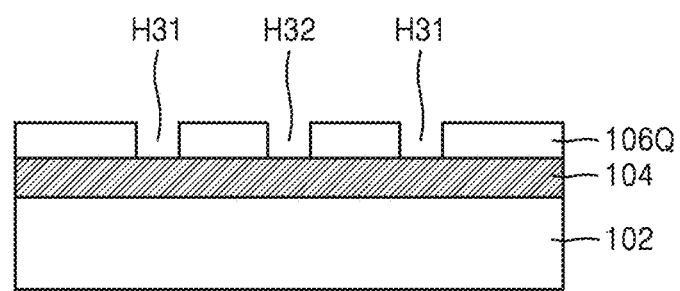

Referring to FIG. 15K, a top surface of the first mask pattern 106Q is exposed by removing the plurality of pillar-shaped guides PG2, the second domain 320B, and the organic liner 410 remaining on the first mask pattern 106Q.

The etch film 104 may be exposed through the plurality of first holes H31 and the self-assembled holes H32 formed in the first mask pattern 106Q.

Figure 15L:
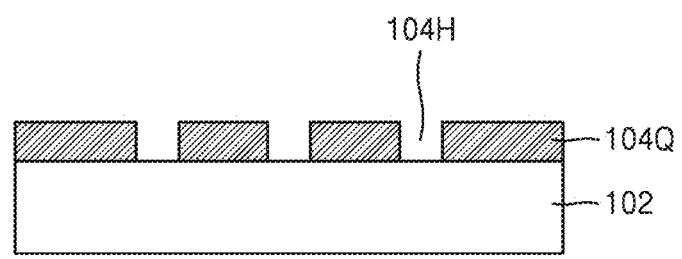

Referring to FIG. 15L, a fine pattern 104Q in which the plurality of holes 104H are formed is formed by etching portions of the etch film 104 that are exposed through the plurality of first holes H31 and the plurality of self-assembled holes H32 using the first mask pattern 106Q (see FIG. 15K) as an etch mask.

A top surface of the fine pattern 104Q is exposed by removing unnecessary films remaining on the fine pattern 104Q.

According to the method of forming a fine pattern of FIGS. 15A through 15L, defects having a ring shape or discontinuous ring-shape may be prevented or inhibited from occurring when the plurality of pillar-shaped guides PG2 have hydrophilic properties. Accordingly, defects may be prevented or inhibited from occurring around the plurality of pillar-shaped guides PG2 and phase separation of the block copolymer layer 120 may be effectively performed.

Figure 16A:
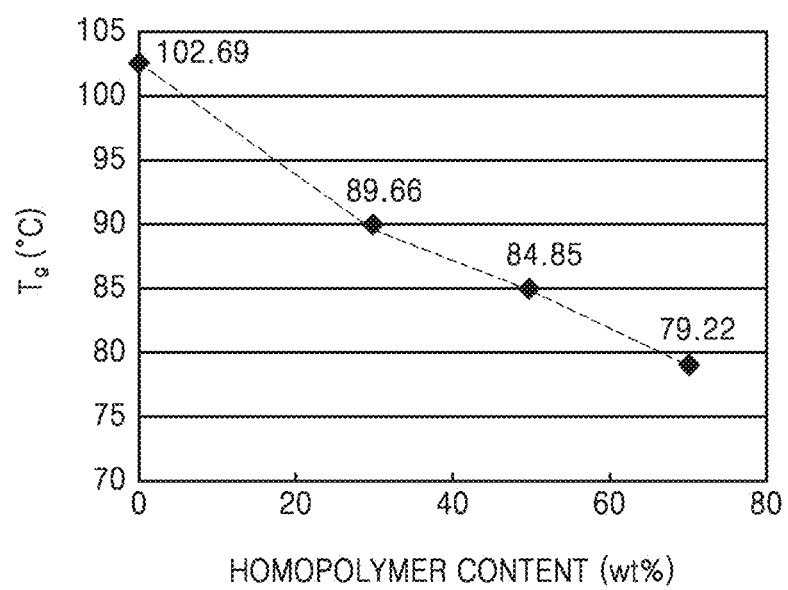
FIG. 16A is a graph obtained after evaluating an influence of a homopolymer included in a block copolymer layer on phase separation effect when a fine pattern is formed on a substrate according to a method of forming a fine pattern according to example embodiments.

FIG. 16A is a graph obtained after evaluating an influence of a homopolymer included in a block copolymer layer, for example, the block copolymer layer 120 of FIGS. 5A and 5B, on phase separation effect when a fine pattern is formed on a substrate according to a method of forming a fine pattern according to example embodiments.

For the evaluation of FIG. 16A, according to example embodiments, a neutral organic liner was formed on a silicon wafer, a block copolymer layer formed of a ternary blend including a PS-b-PMMA pure block copolymer having the bulk period $L_0$ of 54 nm and a PS homopolymer and a PMMA homopolymer whose molecular weights are each 2000 g/mol was coated, and then annealing and phase separation were performed. A PMMA domain was removed using DUV rays, rinsing was performed using IPA, and phase separation effect was evaluated. According to a comparative example, the same evaluation was performed on a block copolymer layer that includes only a pure block copolymer and does not include a homopolymer.

It was found from the evaluation of FIG. 16A that a homopolymer content in a block copolymer layer increases, a glass transition temperature Tg of the block copolymer layer decreases.

Figure 16B:
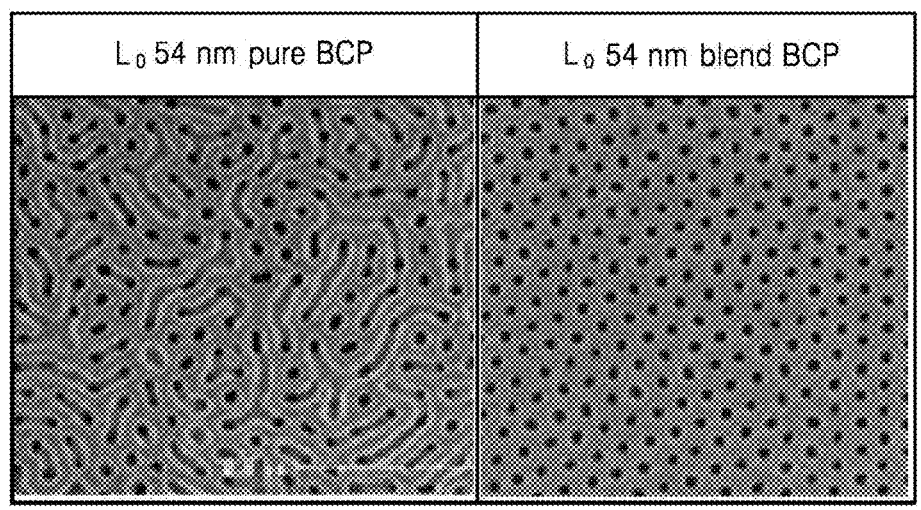
FIG. 16B illustrates phase separation images of block copolymers according to a comparative example and example embodiments used in the evaluation of FIG. 16A.

FIG. 16B illustrates phase separation images of a pure block copolymer (BCP) having the bulk period $L_0$ of 54 nm according to the comparative example, and a blend BCP having the bulk period $L_0$ of 54 nm according to example embodiments when a weight ratio between a pure block copolymer and a homopolymer in a block copolymer layer is 50:50.

From results of FIGS. 16A and 16B, it was found that phase separation effect is improved when a block copolymer layer formed of a ternary blend is used.

Using the same method as that used in FIGS. 16A and 16B, phase separation effect of a block copolymer layer formed of a ternary blend including a pure block copolymer having the bulk period $L_0$ of 54 nm, a PS homopolymer having a molecular weight of 4000 g/mol, and a PMMA homopolymer having a molecular weight of 4000 g/mol was evaluated. The evaluation was performed when a weight ratio between the pure block copolymer and the homopolymers in the block copolymer layer is 95:5, 90:10, and 85:15. As a result, it was found that when a weight ratio between the pure block copolymer and the homopolymers in the block copolymer layer is 85:15, highest phase separation effect is achieved.

Figure 17:
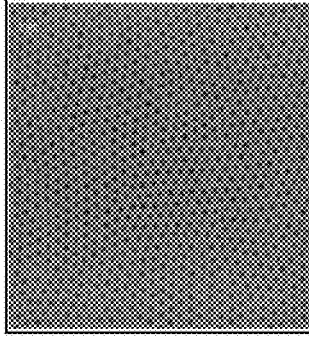
FIG. 17 is a phase separation image obtained after evaluating phase separation effect of a block copolymer layer when a fine pattern is formed on a substrate according to a method of forming a fine pattern according to example embodiments.
Figure 17:
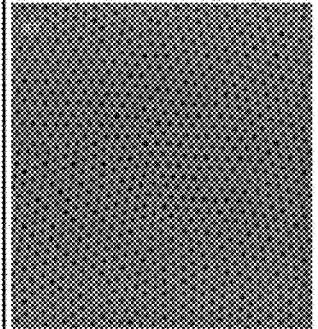
Figure 17:
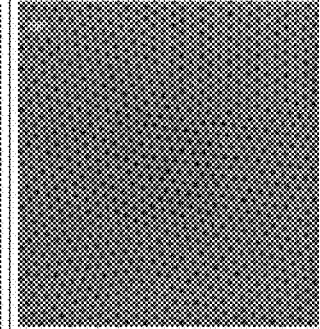

FIG. 17 is a phase separation image obtained after evaluating phase separation effect of a block copolymer layer including a pure block copolymer having the bulk period $L_0$ of 51 nm using the same method as that used in FIGS. 16A and 16B, according to example embodiments.

It is found in FIG. 17 that when a weight ratio between a pure block copolymer and homopolymers including a PS homopolymer and a PMMA homopolymer in a block copolymer layer is 60:40 (E1), 55:45 (E2), and 50:50 (E3), high phase separation effect is achieved.

Figure 18:
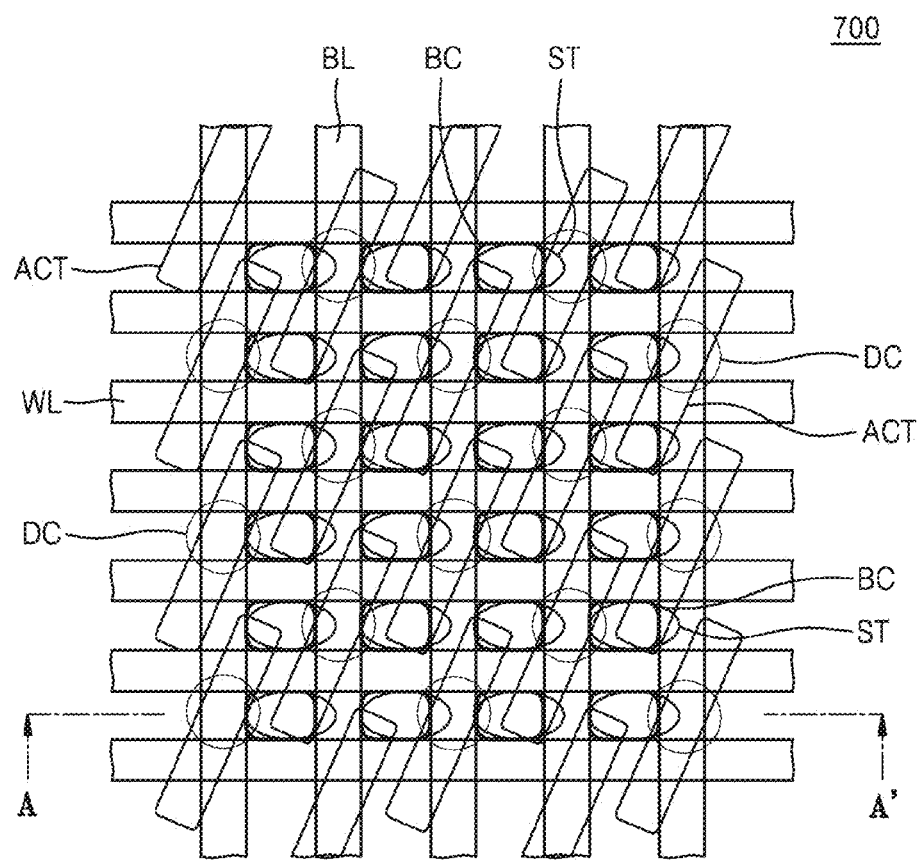
FIG. 18 is a plan layout illustrating an integrated circuit device that may be formed using a method of forming a pattern, according to example embodiments.
Figure 18:
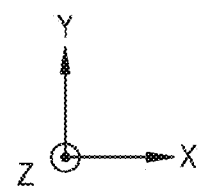

FIG. 18 is a plan layout illustrating an integrated circuit device 700 that may be formed using a method of forming a pattern, according to example embodiments. The plan layout of FIG. 18 may illustrate a memory cell array region of the integrated circuit device 700 that is a semiconductor memory device.

Referring to FIG. 18, the memory cell array region of the integrated circuit device 700 includes a plurality of active regions ACT. A plurality of word lines WL extend in parallel in a first direction (X direction) to cross the plurality of active regions ACT. The plurality of word lines WL may be arranged at equal intervals. Over the plurality of word lines WL, a plurality of bit lines BL extend in parallel in a second direction (Y direction) that intersects the first direction.

The plurality of bit lines BL are connected to the plurality of active regions ACT through a plurality of direct contacts DC.

Each of a plurality of buried contacts BC may have a contact structure that extends from a space between two adjacent bit lines BL from among the plurality of bit lines BL to the top of one bit line BL from among the two adjacent bit lines BL. In example embodiments, the plurality of buried contacts BC may be aligned in the first direction (X direction) and the second direction (Y direction). In example embodiments, the plurality of buried contacts BC may be arranged at equal intervals in the second direction (Y direction). The plurality of buried contacts BC may electrically connect lower electrodes ST of capacitors to the active regions ACT.

Any method of forming a pattern of FIGS. 1A through 15L may be used to form unit devices of FIG. 18, for example, the plurality of active regions ACT, the plurality of word lines WL, the plurality of bit lines BL, the plurality of direct contacts DC, the plurality of buried contacts BC, and the plurality of lower electrodes ST.

FIGS. 19A through 19L are cross-sectional views according to a process order for explaining a method of manufacturing an integrated circuit device using any method of forming a pattern of FIGS. 1A through 15L, according to example embodiments.

In FIGS. 19A through 19L, the same elements as those in FIGS. 1A through 15L are denoted by the same reference numerals, and a detailed explanation thereof will not be given.

Figure 19A:
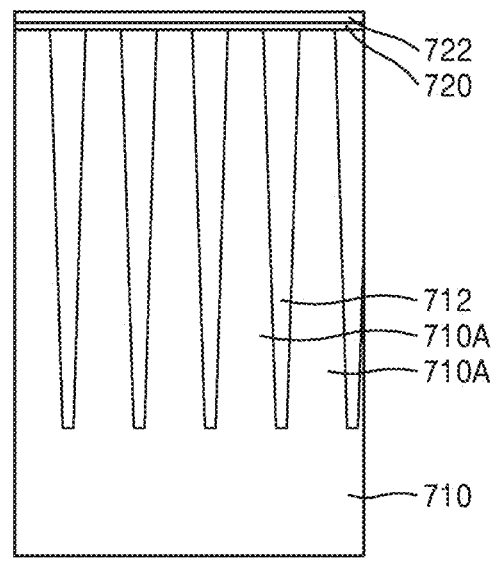
FIGS. 19A through 19L are cross-sectional views according to a process order for explaining a method of manufacturing an integrated circuit device, according to example embodiments.

Referring to FIG. 19A, a plurality of active regions 710A are defined by forming a device isolation film 712 on a substrate 710.

A detailed explanation of the substrate 710 is the same as that of the substrate 102 of FIGS. 1A and 1B.

The plurality of active regions 710A may have relatively long island shapes each having a short axis and a long axis, like the active regions ACT of FIG. 18. In order to define the plurality of active regions 710A, at least one method from among methods of forming a pattern of FIGS. 1A through 15L may be used. For example, a plurality of preliminary active regions having linear shapes that extend in parallel may be defined, and then at least one method from among the methods of forming a pattern of FIGS. 1A through 15L may be used during a trimming process for changing the preliminary active regions having linear shapes into a plurality of active regions having desired island shapes.

The device isolation film 712 may be, but is not limited to, an oxide film, a nitride film, or a combination thereof. The device isolation film 712 may have a single-layer structure including one type of insulating film, or a multi-layer structure including a combination of at least two types of insulating films.

A plurality of word line trenches (not shown) are formed in the substrate 710. The plurality of word line trenches may extend in parallel in the X direction of FIG. 18, and may have linear shapes that cross the plurality of active regions 710A. A plurality of guide dielectric films, the plurality of word lines WL (see FIG. 18), and a plurality of buried insulating films are sequentially formed in the plurality of word line trenches.

In example embodiments, after the word lines WL are formed, source/drain regions may be formed on top surfaces of the plurality of active regions 710A by injecting impurity ions into the substrate 710. In example embodiments, a process of injecting impurity ions for forming the source/drain regions may be performed before the plurality of word lines WL are formed.

A first insulating film 720 and a second insulating film 722 are sequentially formed on the substrate 710. The first insulating film 720 may be, but is not limited to, an oxide film and the second insulating film 722 may be, but is not limited to, a nitride film.

Figure 19B:
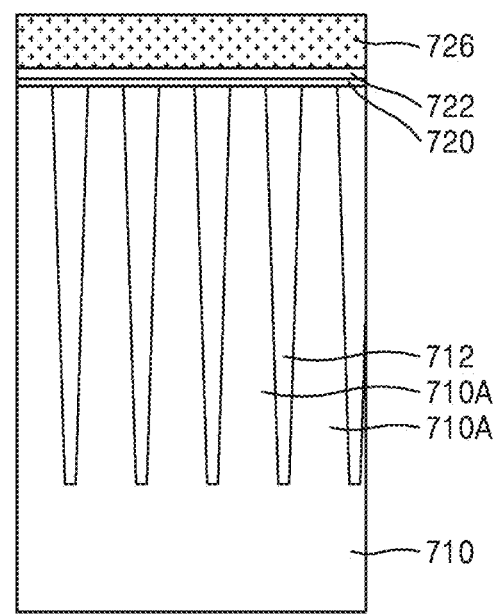

Referring to FIG. 19B, a first conductive layer 726 is formed on the substrate 710.

The first conductive layer 726 may be formed of, but is not limited to, doped polysilicon.

Figure 19C:
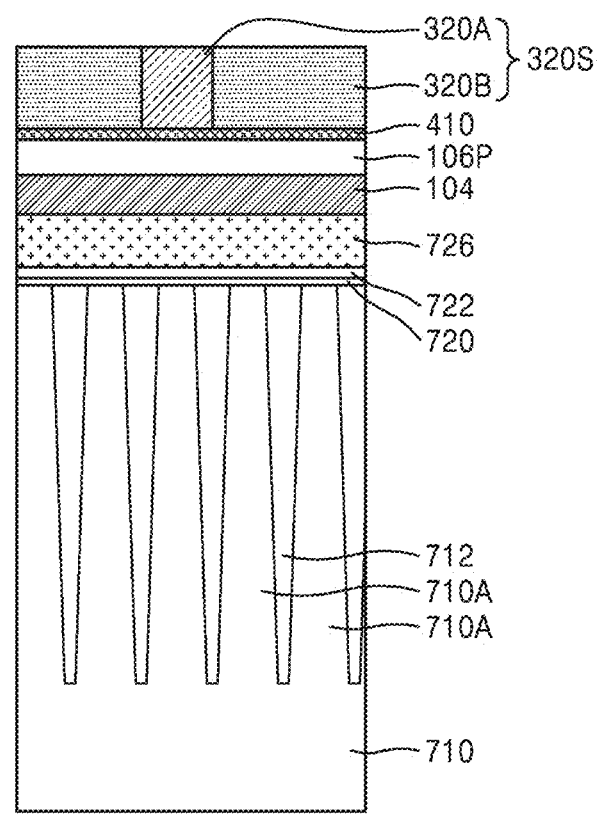

Referring to FIG. 19C, like in FIGS. 15A through 15H, the etch film 104 is formed on the first conductive layer 726, and the self-assembled layer 320S that is phase separated into the first domains 320A and the second domain 320B is formed on the first mask pattern 106P. However, example embodiments are not limited thereto. For example, any of the method of FIGS. 1A through 6B, the method of FIGS. 14A and 14B, and various modifications thereof may be used.

Figure 19D:
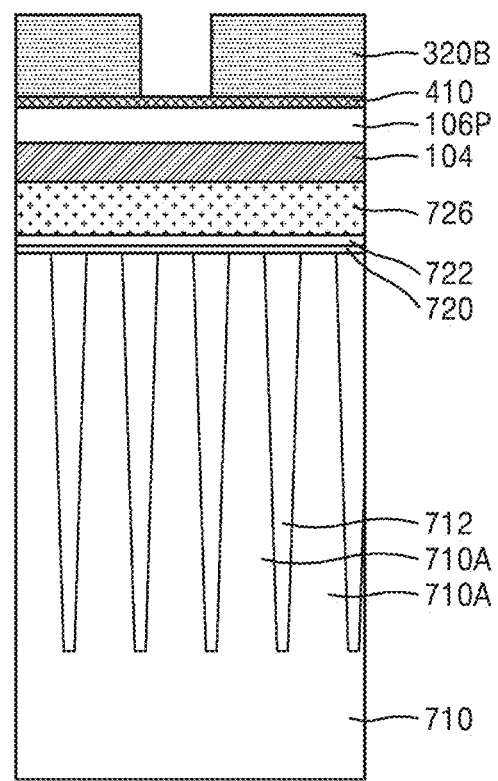

Referring to FIG. 19D, the first domains 320A are removed from the self-assembled layer 320S (see FIG. 19C).

Figure 19E:
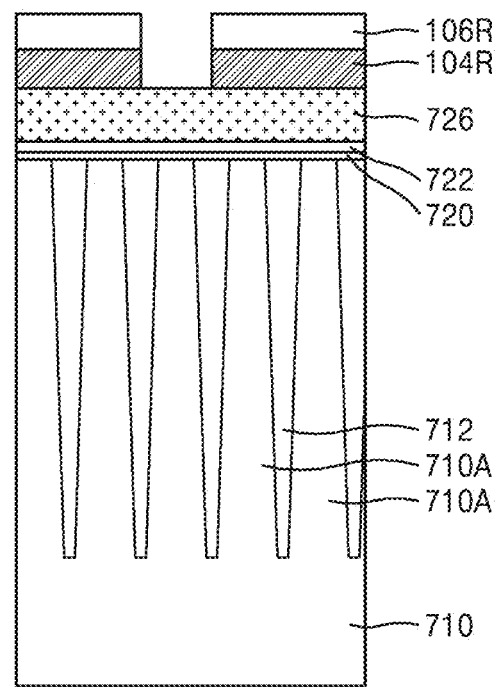

Referring to FIG. 19E, like in FIG. 15J, a first mask pattern 106R in which holes through which the etch film 104 is exposed are formed is formed by etching the first mask pattern 106P (see FIG. 19C) using the plurality of pillar-shaped guides PG2 and the second domain 320B as etch masks.

Unnecessary films on the first mask pattern 106R are removed, and like in FIG. 15L, a fine pattern 104R in which holes through which the first conductive layer 726 is exposed are formed is formed by etching the etch film 104 using the first mask pattern 106R as an etch mask.

Figure 19F:
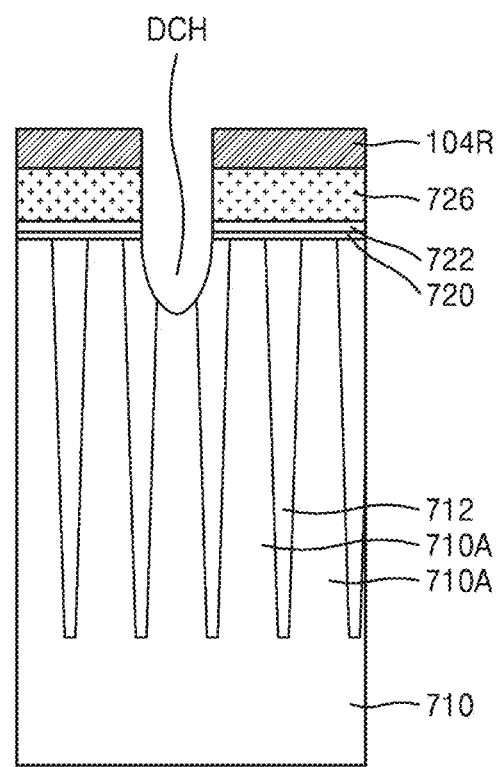

Referring to FIG. 19F, direct contact holes DCH through which the active regions 710A of the substrate 710 are exposed are formed by etching the first conductive layer 726 using the fine pattern 104R as an etch mask and etching an exposed portion of the substrate 710 and an exposed portion of the device isolation film 712.

Although the first mask pattern 106R that covers the fine pattern 104R is removed in FIG. 19F, in example embodiments, the first mask pattern 106R may remain on the fine pattern 104R.

Figure 19G:
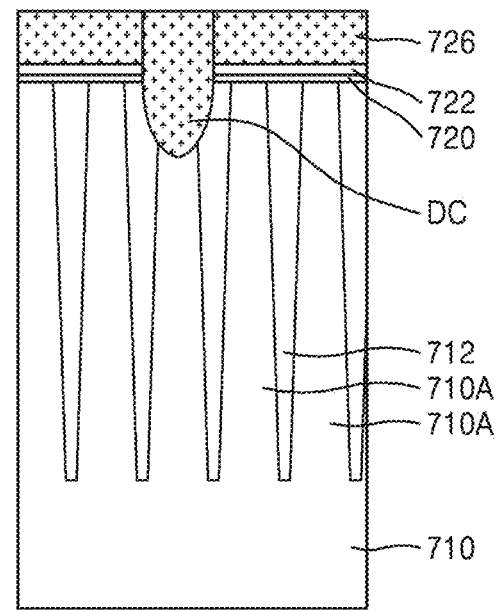

Referring to FIG. 19G, after the fine pattern 104R (see FIG. 19F) is removed, a second conductive layer having a thickness great enough to fill the direct contact holes DCH is formed on the first conductive layer 726 and in the direct contact holes DCH, the second conductive layer is etched back so that the second conductive layer remains only in the direct contacts DCH, and direct contacts DC including the second conductive layer remaining in the direct contact holes DCH are formed.

The direct contacts DC may be formed of, but are not limited to, doped polysilicon.

Figure 19H:
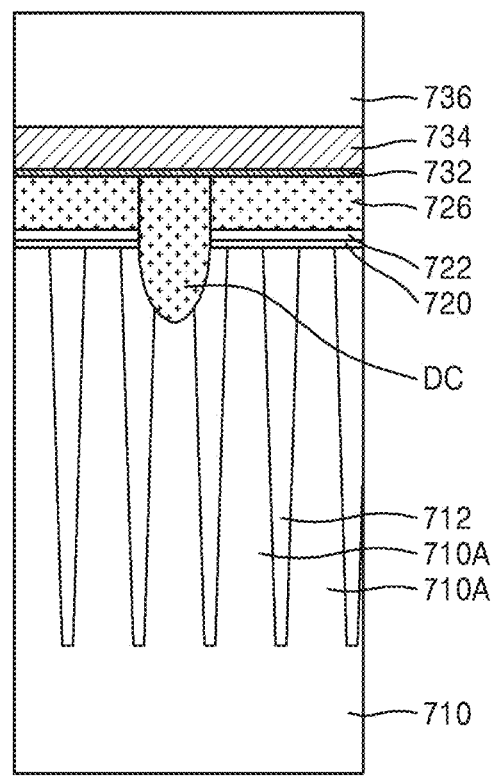

Referring to FIG. 19H, a third conductive layer 732, a fourth conductive layer 734, and an insulating capping layer 736 are sequentially formed on the first conductive layer 726 and the direct contacts DC.

Each of the third conductive layer 732 and the fourth conductive layer 734 may be formed of, but is not limited to, TiN, TiSiN, W, tungsten silicide, or a combination thereof. In example embodiments, the third conductive layer 732 may include TiSiN and the fourth conductive layer 7354 may include W.

The insulating capping layer 736 may be formed of a silicon nitride film.

Figure 19I:
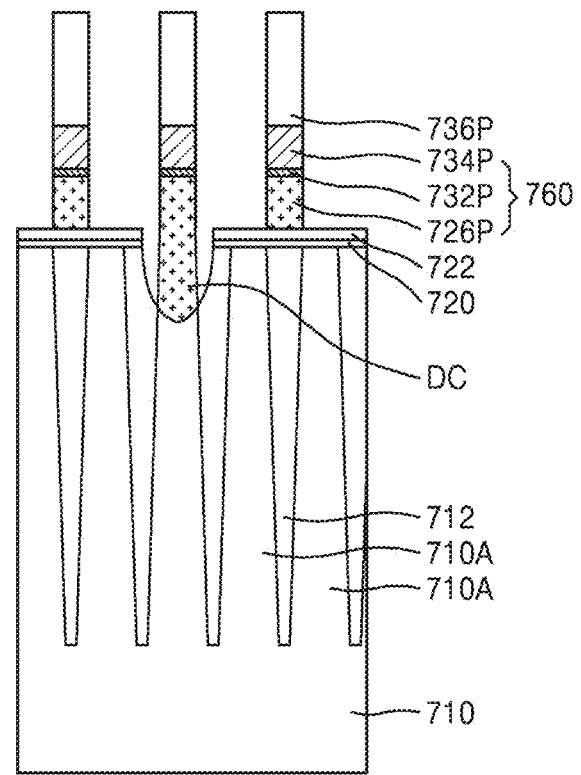

Referring to FIG. 19I, an insulating capping pattern 736P is formed by patterning the insulating capping layer 736 using a photolithography process, and a plurality of bit lines 760 are formed by etching a part of a lower structure using the insulating capping pattern 736P as an etch mask.

In order to form the plurality of bit lines 760, the plurality of bit lines 760 including a first conductive pattern 726P, a third conductive pattern 732P, and a fourth conductive pattern 734P are formed by sequentially etching parts of the fourth conductive layer 734, the third conductive layer 732, the first conductive layer 726, and the direct contacts DC using the insulating capping pattern 736P as an etch mask. The plurality of bit lines 760 may be connected to the active regions 710A of the substrate 710 through the direct contacts DC.

Figure 19J:
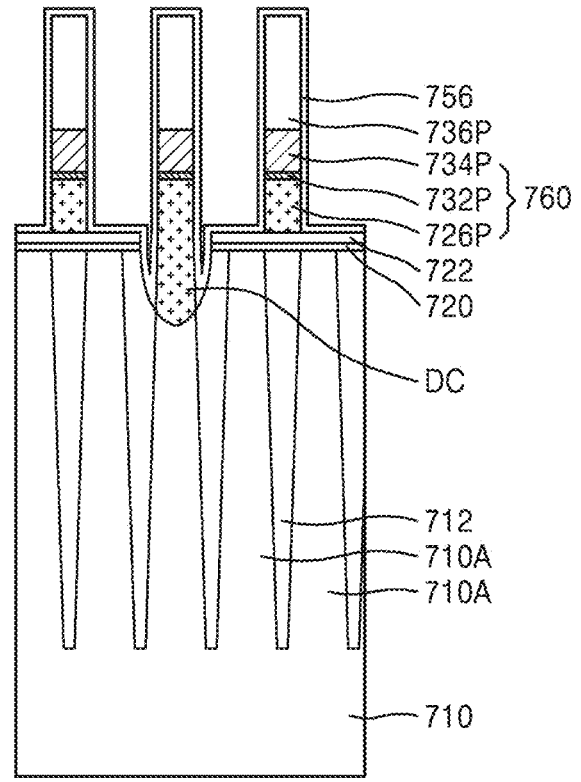

Referring to FIG. 19J, an insulating liner 756 is formed on an exposed top surface of a resultant structure including the plurality of bit lines 760.

The insulating liner 756 may be formed of, but is not limited to, a nitride film.

Figure 19K:
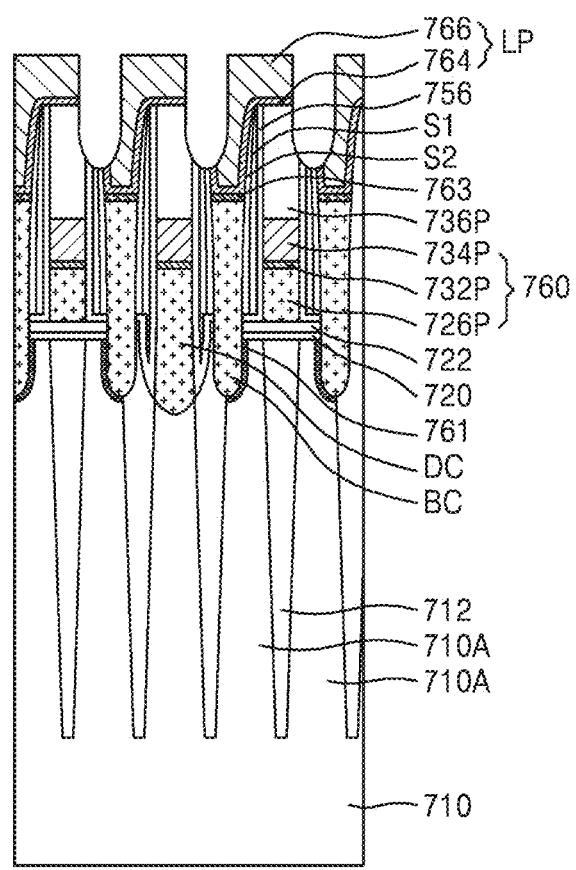

Referring to FIG. 19K, the plurality of buried contacts BC (see FIG. 18) and a plurality of conductive landing pads LP that are connected to the plurality of buried contacts BC are formed in a space between the plurality of bit lines 760 in a resultant structure of FIG. 19J.

In detail, insulating spacers S1 and S2 that cover the insulating liner 756 are formed on side walls of each of the plurality of bit lines 760, a plurality of insulating patterns (not shown in FIG. 19K) that define a plurality of holes for forming the buried contacts BC (see FIG. 18) in a space between the plurality of bit lines 760 are formed, the active regions 710A of the substrate 710 are exposed through the plurality of holes, and a metal silicide film 761 is formed on a surface of each of the exposed active regions 710A. The plurality of buried contacts BC that are respectively connected to the active regions 710A are formed by filling a conductive layer in lower portions of the plurality of holes.

In example embodiments, the metal silicide film 761 may be formed of cobalt silicide. However, the metal silicide film 761 is not limited thereto, and may be formed of any of various metal silicide materials. In example embodiments, the plurality of buried contacts BC may be formed of doped polysilicon. In example embodiments, the metal silicide film 761 may be omitted.

In example embodiments, the insulating spacers S1 and S2 may be formed of a silicon oxide film, a silicon nitride film, air, or a combination thereof. Although the insulating spacers S1 and S2 have a double-layer structure, example embodiments are not limited thereto and the insulating spacers S1 and S2 may have a single- or three-layer structure. The plurality of insulating patterns may be formed of a nitride film, an oxide film, or a combination thereof.

A metal silicide film 763 is formed on the plurality of buried contacts BC in the plurality of holes between the plurality of bit lines 760. In example embodiments, the metal silicide film 763 may be formed of cobalt silicide. However, the metal silicide film 763 is not limited thereto, and may be formed of any of various metal silicide materials. In example embodiments, the metal silicide film 763 may be omitted.

A conductive barrier film and a conductive layer are formed, and the conductive barrier film and the conductive layer are etched back to expose the insulating liner 756. As a result, a part of the conductive barrier film and a part of the conductive layer may remain as a conductive barrier film 764 and a conductive layer 766 that are formed on the metal silicide film 763 to cover the plurality of bit lines 760 and fill the plurality of holes.

In example embodiments, the conductive barrier film 764 may have a Ti/TiN stacked structure. In example embodiments, the conductive layer 766 may be formed of doped polysilicon, metal, metal silicide, conductive metal nitride, or a combination thereof.

In a cell array region, a mask pattern (not shown) that exposes a part of the conductive layer 766 is formed on the conductive layer 766, the conductive barrier film 764, the conductive layer 766, and insulating films that are formed around the conductive barrier film 764 and the conductive layer 766 are etched using the mask pattern as an etch mask, and a plurality of landing pads LP including remaining portions of the conductive barrier film 764 and the conductive layer 766 are formed.

The plurality of landing pads LP may have a plurality of island-shaped patterns that are spaced apart from one another, like the plurality of buried contacts BC of FIG. 18.

A photolithography process may be used in order to form the plurality of landing pads LP. In this case, in order to form the plurality of landing pads LP, any of the methods of forming a pattern of FIGS. 1A through 15L may be used.

Figure 19L:
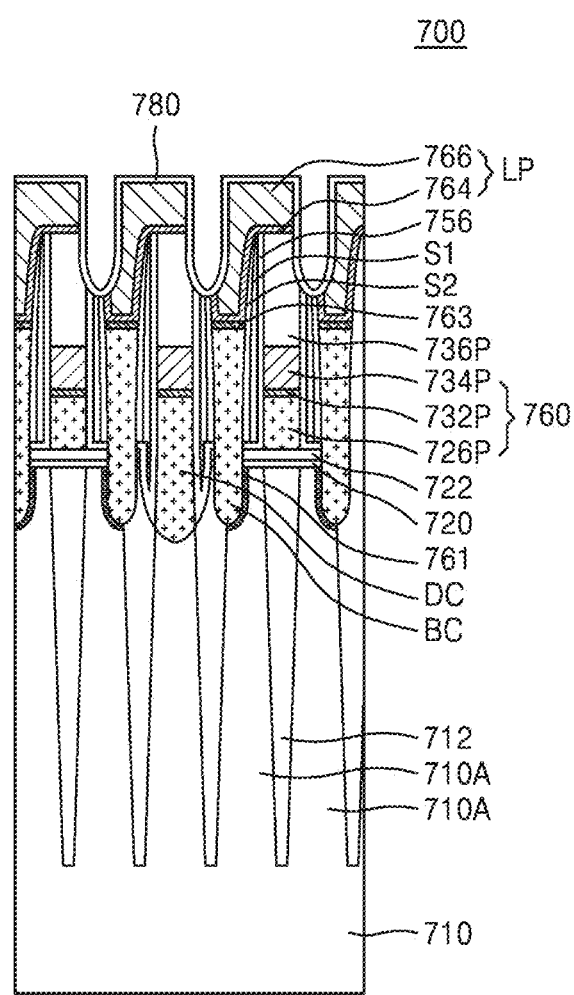

Referring to FIG. 19L, an insulating thin film 780 is formed on a top surface of a resultant structure including the plurality of conductive landing pads LP. The insulating thin film 780 may be, but is not limited to, a nitride film.

The integrated circuit device 700 may be formed by forming an insulating film on the insulating thin film 780 and forming a plurality of lower electrodes of capacitors that may be electrically connected to the plurality of conductive landing pads LP in the cell array region. The lower electrodes may correspond to the lower electrodes ST of FIG. 18.

Figure 20:
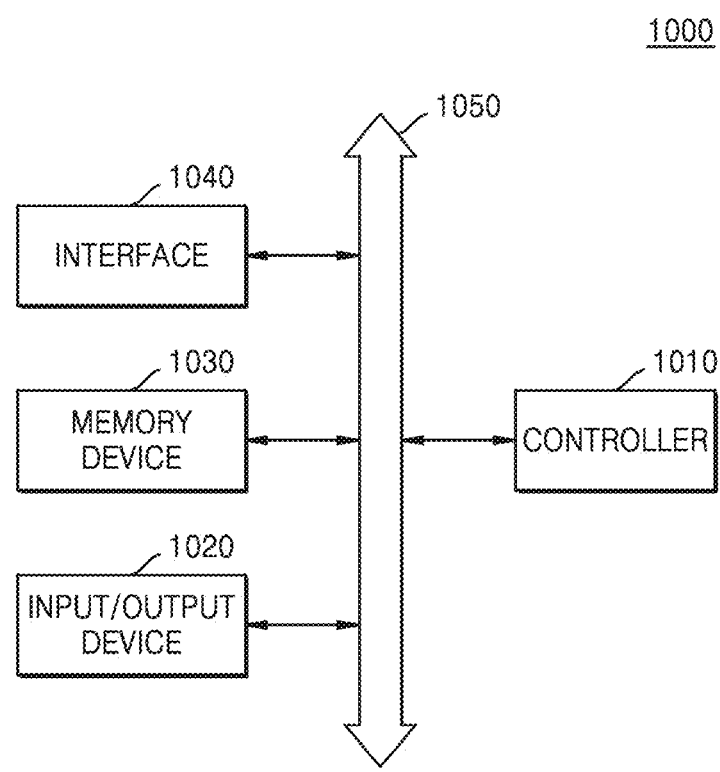
FIG. 20 is a block diagram illustrating a system including an integrated circuit device, according to example embodiments.

FIG. 20 is a block diagram illustrating a system 1000 including an integrated circuit device, according to example embodiments.

The system 1000 includes a controller 1010, an input/output device 1020, a memory device 1030, and an interface 1040. The system 1000 may be a mobile system or a system that transmits or receives information. In example embodiments, the mobile system may be a personal digital assistant (PDA), a portable computer, a web tablet, a wireless phone, a mobile phone, a digital music player, or a memory card. The controller 1010 for controlling a program executed in the system 1000 may include a microprocessor, a digital signal processor, a microcontroller, or the like. The input/output device 1020 may be used to input or output data of the system 1000. The system 1000 may be connected to an external device, e.g., a personal computer or a network, using the input/output device 1020, and may exchange data with the external device. The input/output device 1020 may be, for example, a keypad, a keyboard, or a display device.

The memory device 1030 may store code and/or data for operating the controller 1010, or may store data processed by the controller 1010. The memory device 1030 includes at least one integrated circuit obtained using a method of forming a pattern or a method of manufacturing an integrated circuit device of the example embodiments. For example, the memory device 1030 includes at least one integrated circuit device obtained using any one from among the methods of forming a pattern of FIGS. 1A through 15L or any one from among the methods of manufacturing an integrated circuit device of FIGS. 18 through 19L.

The interface 1040 may be a transmission path through which data is transmitted between the system 1000 and the external device. The controller 1010, the input/output device 1020, the memory device 1030, and the interface 1040 may communicate with one another via a bus 1050. The system 1000 may be used in a mobile phone, an MP3 player, a navigation system, a portable multimedia player (PMP), a solid-state disc (SSD), or a household appliance.

Figure 21:
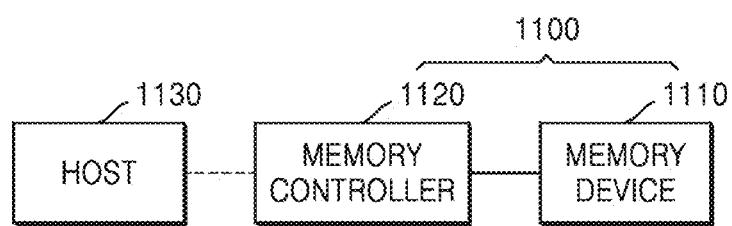
FIG. 21 is a block diagram illustrating a memory card including an integrated circuit device, according to example embodiments.

FIG. 21 is a block diagram illustrating a memory card 1100 including an integrated circuit device, according to example embodiments.

The memory card 1100 includes a memory device 1110 and a memory controller 1120.

The memory device 1110 may store data. In example embodiments, the storage unit 11110 may be nonvolatile and thus it may retain stored data even when powered off. The memory device 1110 includes at least one integrated circuit device obtained using a method of forming a pattern or a method of manufacturing an integrated circuit device according to example embodiments. For example, the memory device 1110 includes at least one integrated circuit device obtained using any one from among the methods of forming a pattern of FIGS. 1A through 15L and any one from among the methods of manufacturing an integrated circuit device of FIGS. 18 through 19L.

The memory controller 1120 may read data stored in the memory device 1110 or may store data in the memory device 1110 in response to a read/write request of a host 1130. The memory controller 1120 includes at least one integrated circuit device obtained using any method of the example embodiments. For example, the memory controller 1120 includes at least one integrated circuit device obtained using any one from among the methods of forming a pattern of FIGS. 1A through 15L or any one from among the methods of manufacturing an integrated circuit device of FIGS. 18 through 19L.

As described above, according to a method of forming a fine pattern and a method of manufacturing an integrated circuit device according to example embodiments, defects having a ring or discontinuous ring shape may be prevented or inhibited from occurring around a plurality of pillar-shaped guides during a phase separation process of a block copolymer layer and a process of forming a self-assembled layer obtained through the phase separation process, the phase separation process of the block copolymer layer may be effectively performed, and thus a plurality of hole patterns that are repeatedly formed at fine pitches may be easily formed in order to form a pattern that is necessary to manufacture a highly integrated semiconductor device exceeding a resolution limit in a photolithography process.

While the inventive concepts have been particularly shown and described with reference to example embodiments thereof, it will be understood that various changes in form and details may be made therein without departing from the spirit and scope of the following claims.

What is claimed is:
1. A method of forming a pattern, the method comprising:
forming a plurality of pillar-shaped guides on a feature layer, the plurality of pillar-shaped guides being regularly arranged;
forming a block copolymer layer on the feature layer around the plurality of pillar-shaped guides, the block copolymer layer being made of a polymer blend including a pure block copolymer and a plurality of homopolymers, the pure block copolymer including a first polymer block having a first repeat unit and a second polymer block having a second repeat unit, the plurality of homopolymers including a first homopolymer and a second homopolymer;
phase separating the block copolymer layer including,
forming a plurality of first domains regularly arranged on the feature layer with the plurality of pillar- shaped guides, the plurality of first domains including the first polymer block and the first homopolymer, and forming a second domain on the feature layer surrounding the plurality of pillar-shaped guides and the plurality of first domains, the second domain including the second polymer block and the second homopolymer;

removing the plurality of first domains; and forming a plurality of holes corresponding with the plurality of first domains in the feature layer by etching the feature layer using the plurality of pillar-shaped guides and the second domain as etch masks.

2. The method of claim 1, wherein the forming a block copolymer layer forms the first homopolymer having the first repeat unit and the second homopolymer having the second repeat unit.

3. The method of claim 1, wherein the forming a block copolymer layer forms each of the first homopolymer and the second homopolymer having a molecular weight ranging from about 1,000 g/mol to about 10,000 g/mol.

4. The method of claim 1, wherein the forming a block copolymer layer includes coating the polymer blend on the feature layer, the polymer blend including the pure block copolymer and the plurality of homopolymers mixed at a weight ratio ranging from about 50:50 to about 95:5.

5. The method of claim 4, wherein the forming a block copolymer layer forms the first homopolymer having the first repeat unit and the second homopolymer having the second repeat unit, and wherein the coating the polymer blend coats the first homopolymer and the second homopolymer having a weight ratio ranging from about 30:70 to about 50:50.

6. The method of claim 4, wherein the forming a block copolymer layer forms the first polymer block and the second polymer block having a volume ratio ranging from about 20:80 to about 40:60.

7. The method of claim 1, wherein the forming a block copolymer layer forms the first polymer block including one of poly(methyl methacrylate) (PMMA), poly(ethylene oxide) (PEO), poly(lactic acid) (PLA), and polyisoprene (PI), and the second polymer block including polystyrene (PS).

8. The method of claim 1, wherein the forming a plurality of pillar-shaped guides forms the plurality of pillar-shaped guides having a material including silicon (Si).

9. The method of claim 1, wherein the forming a plurality of pillar-shaped guides forms the plurality of pillar-shaped guides having a width in a range from about 0.5 to about 1.5 times a bulk period $L_0$ of the block copolymer layer, and the bulk period $L_0$ of the block copolymer layer ranging from about 40 nm to about 60 nm.

10. The method of claim 1, wherein the forming a plurality of pillar-shaped guides forms the plurality of pillar-shaped guides arranged in a hexagonal array having a first pitch that is 1.73 times a bulk period $L_0$ of the block copolymer layer, and the bulk period $L_0$ of the block copolymer layer ranging from about 40 to about 60 nm.

11. The method of claim 1, wherein the forming a plurality of pillar-shaped guides forms the plurality of pillar-shaped guides having a first pitch that is N times (N being an integer equal to or greater than 2, and the bulk period $L_0$ of the block copolymer layer ranging from about 40 nm to about 60 nm.

12. The method of claim 1, wherein the forming a plurality of pillar-shaped guides forms the plurality of pillar-shaped guides regularly arranged to have a first pitch, and the phase separating the block copolymer layer arranges the plurality of first domains in a cylindrical shape at a central portion between at least two pillar-shaped guides of the plurality of pillar-shaped guides, and the plurality of pillar-shaped guides and the plurality of first domains are regularly arranged to have a second pitch, the second pitch being less than the first pitch.

13. The method of claim 1, prior to the forming a block copolymer layer, the method further comprising:

forming an organic liner covering exposed surfaces of the plurality of pillar-shaped guides after the forming a plurality of pillar-shaped guides.

14. The method of claim 13, wherein the forming an organic liner forms the organic liner having a random copolymer including a first block having the first repeat unit, a second block having the second repeat unit, and a third block having a repeat unit including a primary hydroxyl group.

15. The method of claim 14, wherein the forming an organic liner forms the organic liner having the random copolymer including the third block in an amount ranging from about 0.01 weight % to about 10 weight % based on a total weight of the random copolymer.

16. The method of claim 14, wherein the forming an organic liner attaches the random copolymer to the exposed surfaces of the plurality of pillar-shaped guides using the primary hydroxyl group of the third block as an anchoring group.

17. The method of claim 14, wherein the forming an organic liner comprises:

coating a random copolymer composition on the exposed surfaces of the plurality of pillar-shaped guides, the random copolymer composition including the random copolymer;

reacting the primary hydroxyl group of the third block and the plurality of pillar-shaped guides with each other by heat-treating the random copolymer composition coated on the exposed surfaces of the plurality of pillar-shaped guides, the random copolymer being attached to the exposed surfaces of the plurality of pillar-shaped guides; and removing a non-reacted portion of the random copolymer composition using an organic solvent to expose the organic liner covering the exposed surfaces of the plurality of pillar-shaped guides.

18. A method of forming a pattern, the method comprising:

forming a feature layer on a substrate;

forming a plurality of first holes in the feature layer, the plurality of first holes being regularly arranged to have a first pitch;

forming a plurality of pillar-shaped guides filling the plurality of first holes, the plurality of pillar-shaped guides protruding upward further than the feature layer;

forming a block copolymer layer on the feature layer around the plurality of pillar-shaped guides, the block copolymer layer made of a ternary blend including a pure block copolymer including a first polymer block having a first repeat unit and a second polymer block having a second repeat unit, a first homopolymer having the first repeat unit, and a second homopolymer having the second repeat unit;

phase separating the block copolymer layer including,
   forming a plurality of first domains regularly arranged on the feature layer with the plurality of pillar-shaped guides, and
   forming a second domain on the feature layer surrounding the plurality of pillar-shaped guides and the plurality of first domains;
removing the plurality of first domains; and
forming a plurality of second holes in the feature layer by etching the feature layer using the plurality of pillar-shaped guides and the second domain as etch masks.

19. A method comprising:
forming a plurality of pillar-shaped guides on a feature layer, the plurality of pillar-shaped guides being regularly arranged;
forming a block copolymer layer around the plurality of pillar-shaped guides by coating a polymer blend on the feature layer,
the polymer blend including a first polymer block, a second polymer block and a plurality of homopolymers, the first polymer block including one of poly(methyl methacrylate) (PMMA), poly(ethylene oxide) (PEO), poly(lactic acid) (PLA), and polyisoprene (PI), and the second polymer block including polystyrene (PS), and
the polymer blend including the first and second polymer blocks and the plurality of homopolymers mixed at a weight ratio ranging from about 50:50 to about 95:5; and
phase separating the block copolymer layer.

20. The method of claim 19,
wherein the phase separating the block copolymer comprises,
forming a plurality of first domains regularly arranged on the feature layer with the plurality of pillar-shaped guides, the plurality of first domains including the first polymer block and a first homopolymer of the plurality of homopolymers, and
forming a second domain on the feature layer surrounding the plurality of pillar-shaped guides and the plurality of first domains, the second domain including the second polymer block and a second homopolymer of the plurality of homopolymers, and
the method further comprises,
removing the plurality of first domains; and
forming a plurality of holes corresponding with the plurality of first domains in the feature layer by etching the feature layer using the plurality of pillar-shaped guides and the second domain as etch masks.

* * * * *